US012127458B2

(12) United States Patent
An et al.

(10) Patent No.: US 12,127,458 B2
(45) Date of Patent: Oct. 22, 2024

(54) DISPLAY DEVICE

(71) Applicant: Samsung Display Co., Ltd., Yongin-si (KR)

(72) Inventors: Jun-Yong An, Asan-si (KR); Min Jeong Kim, Hwaseong-si (KR); Hyungjun Park, Seoul (KR); Nuree Um, Hwaseong-si (KR); Kwang-Chul Jung, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/682,392

(22) Filed: Feb. 28, 2022

(65) Prior Publication Data

US 2022/0336569 A1    Oct. 20, 2022

(30) Foreign Application Priority Data

Apr. 15, 2021 (KR) .................. 10-2021-0049132

(51) Int. Cl.
*G09G 3/3233* (2016.01)
*H10K 59/131* (2023.01)
(52) U.S. Cl.
CPC ....... *H10K 59/1315* (2023.02); *G09G 3/3233* (2013.01); *G09G 2300/0819* (2013.01)
(58) Field of Classification Search
CPC .. H10K 59/1315; H10K 59/131; H10K 59/12; G09G 3/3233; G09G 2300/0819; G09G 2300/0404; G09G 2300/0426; G09G 2330/028; H01L 27/124
See application file for complete search history.

(56) References Cited

U.S. PATENT DOCUMENTS 10,103,205 B2    10/2018    Gu et al.
10,134,772 B2    11/2018    Yang et al.
10,651,264 B2     5/2020    An et al.
(Continued)

FOREIGN PATENT DOCUMENTS

KR    1020200037027 A    4/2020
WO       2016188257 A1    1/2016

OTHER PUBLICATIONS

Extended European Search Report for Application No. 22167063. 1-1020 dated Oct. 13, 2022.

*Primary Examiner* — Jeff Piziali
(74) *Attorney, Agent, or Firm* — CANTOR COLBURN LLP

(57) ABSTRACT

A display device includes a substrate including sub-pixel circuit areas that are arranged in m rows and n columns, where m and n are positive integers, first gate lines extending in a row direction, data lines extending in a column direction, initialization power lines extending in the row direction, including first power lines disposed in sub-pixel circuit areas of odd rows and receiving a first initialization voltage and second power lines disposed in sub-pixel circuit areas of even rows and receiving a second initialization voltage, and transmission lines extending in the column direction, including first transmission lines disposed in sub-pixel circuit areas of odd columns and receiving the first initialization voltage from the first power lines and second transmission lines disposed in sub-pixel circuit areas of even columns and receiving the second initialization voltage from the second power lines.

21 Claims, 11 Drawing Sheets

(56) References Cited

U.S. PATENT DOCUMENTS

| | | | |
|---|---|---|---|
| 11,574,960 B2* | 2/2023 | Wang | H10K 59/352 |
| 11,586,086 B2* | 2/2023 | Wang | G09G 3/3614 |
| 2016/0240593 A1* | 8/2016 | Gu | G09G 3/3225 |
| 2017/0117334 A1* | 4/2017 | Guo | H01L 27/02 |
| 2017/0301696 A1* | 10/2017 | Yang | H10K 59/00 |
| 2018/0006105 A1* | 1/2018 | Kim | G09G 3/3225 |
| 2018/0061324 A1* | 3/2018 | Kim | G09G 3/3233 |
| 2018/0190752 A1* | 7/2018 | An | H10K 59/1213 |
| 2019/0355802 A1* | 11/2019 | Shim | H10K 59/121 |
| 2020/0044009 A1* | 2/2020 | Kwak | G09G 3/3233 |
| 2020/0105849 A1* | 4/2020 | Kim | H10K 59/1216 |
| 2021/0183313 A1* | 6/2021 | Dong | H10K 59/131 |
| 2022/0327998 A1* | 10/2022 | Liu | G09G 3/3266 |

\* cited by examiner

DISPLAY DEVICE

This application claims priority to Korean Patent Application No. 10-2021-0049132, filed on Apr. 15, 2021, and all the benefits accruing therefrom under 35 U.S.C. § 119, the content of which in its entirety is herein incorporated by reference.

BACKGROUND

1. Field

Embodiments relate to a display device.

2. Description of the Related Art

A display device may include a display area that displays an image and includes a plurality of sub-pixel circuit areas. Also, the display device may include sub-pixels respectively disposed in the sub-pixel circuit areas and first and second power lines that provide first and second initialization voltages to the sub-pixels and extend in a row direction. Each of the sub-pixels may include transistors and a light emitting diode.

SUMMARY

First and second power lines may be disposed in each row in which sub-pixels are arranged. In this case, one sub-pixel may need at least two contact areas to receive the first and second initialization voltages from the first and second power lines. Accordingly, a resolution of the display device may relatively decrease since a size of unit sub-pixel may relatively increase, and a number of sub-pixels disposed in the display area may relatively decrease.

Embodiments provide a display device with high resolution.

A display device in an embodiment includes a substrate that includes a plurality of sub-pixel circuit areas that are arranged in m rows and n columns, where m and n are positive integers, a plurality of first gate lines that extend in a row direction, a plurality of data lines that extend in a column direction, a plurality of initialization power lines that extend in the row direction and a plurality of transmission lines that extend in the column direction. The plurality of initialization power lines includes, a plurality of first power lines that are disposed in sub-pixel circuit areas of odd rows among the subpixel circuit areas and receive a first initialization voltage and a plurality of second power lines that are disposed in sub-pixel circuit areas of even rows among the sub-pixel circuit areas and receive a second initialization voltage. The plurality of transmission lines includes a plurality of first transmission lines that are disposed in sub-pixel circuit areas of odd columns among the sub-pixel circuit areas and receive the first initialization voltage from the plurality of first power lines and a plurality of second transmission lines that are disposed in sub-pixel circuit areas of even columns among the sub-pixel circuit areas and receive the second initialization voltage from the second power lines.

In an embodiment, the plurality of first power lines and the plurality of second power lines may be alternately arranged with each other, and the plurality of first transmission lines and the plurality of second transmission lines may be alternately arranged with each other.

In an embodiment, the plurality of first gate lines may be disposed one by one in each of the sub-pixel circuit areas in the odd rows and the even rows, the plurality of data lines may be disposed one by one in each of the odd columns and the even columns, the plurality of first power lines may be disposed in one side of first gate lines disposed in the sub-pixel circuit areas of the odd rows among the plurality of first gate lines, the second power lines may be disposed in one side of first gate lines disposed in the sub-pixel circuit areas of the even rows among the plurality of first gate lines, the first transmission lines may be disposed in one side of data lines disposed in the sub pixel-circuit areas of the odd columns among the plurality of data lines, and the second transmission lines may be disposed in one side of data lines disposed in the sub-pixel circuit areas of the even columns among the plurality of data lines.

In an embodiment, a first transmission line of the plurality of first transmission lines may be connected to a first power line of the plurality of first power lines through a first contact hole defined in a portion at which the first power line and the first transmission line cross each other, and a second transmission line of the plurality of second transmission lines may be connected to a second power line of the plurality of second power lines through a second contact hole defined in a portion at which the second power line and the second transmission line cross each other.

In an embodiment, the plurality of first power lines and the plurality of second transmission lines may not contact each other, and the plurality of second power lines and the plurality of first transmission lines may not contact each other.

In an embodiment, the first contact hole may be defined in a sub-pixel circuit area in which the odd row and the odd column cross among the sub-pixel circuit areas, and the second contact hole may be defined in a sub-pixel circuit area in which the odd row and the even column cross among the sub-pixel circuit areas.

In an embodiment, the display device may further include a sub-pixel circuit and a light emitting diode disposed in each of the sub-pixel circuit areas, a first active pattern disposed in each of the sub-pixel circuit areas of the odd rows among the sub-pixel circuit areas and a second active pattern disposed in each of the sub-pixel circuit areas of the even rows among the sub-pixel circuit areas, the first active pattern may be connected to the first transmission line through a third contact hole, the first active pattern may be connected to the second transmission line through a fourth contact hole, the second active pattern may be connected to the first transmission line through a fifth contact hole, and the second active pattern may be connected to the second transmission line through a sixth contact hole.

In an embodiment, the display device may further include a plurality of gate electrodes disposed on the first active pattern, and spaced apart from the first gate line, a second gate line spaced apart from the first gate line and the gate electrodes on the first active pattern and a third gate line spaced apart from the gate electrodes, the first gate line and the second gate line on the first active pattern, each of a plurality of portions in which the first active pattern and the gate electrodes overlap may be defined as a first transistor.

In an embodiment, the display device may further include a first connection pattern spaced apart from the data line, the first active pattern may be connected to the first connection pattern through a seventh contact hole, and the first connection pattern may be disposed on the first power lines and may be connected to the first transistor.

In an embodiment, the first initialization voltage may be provided from the first power line to the first transmission line through the first contact hole, may be provided from the first transmission line to the first active pattern through the third contact hole, may be provided from the first active pattern to the first connection pattern through the seventh contact hole, and may be provided from the first connection pattern to the first transistor.

In an embodiment, the display device may further include a second connection pattern spaced apart from a data line of the plurality of data lines, the first active pattern may be connected to the second connection pattern through a eighth contact hole, and the second connection pattern may be disposed on the plurality of second power lines and may be connected to the light emitting diode.

In an embodiment, the second initialization voltage may be provided from the second power line to the second transmission line through the second contact hole, may be provided from the second transmission line to the first active pattern through the fourth contact hole, may be provided from the first active pattern to the second connection pattern through the eighth contact hole, and may be provided from the second connection pattern to the light emitting diode.

In an embodiment, the display device may further include a plurality of gate electrodes disposed on the second active pattern, and spaced apart from a first gate line of the plurality of first gate lines, a second gate line spaced apart from the first gate line and the plurality of gate electrodes on the second active pattern and a third gate line spaced apart from the plurality of gate electrodes, the first gate line and the second gate line on the second active pattern, each of a plurality of portions in which the second active pattern and the plurality of gate electrodes overlap may be defined as a first transistor.

In an embodiment, the display device may further include a third connection pattern spaced apart from a data line of the plurality of data lines, the second active pattern may be connected to the third connection pattern through a ninth contact hole, and the third connection pattern may be disposed on the first power line and may be connected to the first transistor.

In an embodiment, the first initialization voltage may be provided from a first transmission line of the plurality of first transmission lines to the second active pattern through the fifth contact hole, may be provided from the second active pattern to the third connection pattern through the ninth contact hole, and may be provided from the third connection pattern to the first transistor.

In an embodiment, the display device may further include a fourth connection pattern spaced apart from the data line, the second active pattern may be connected to the fourth connection pattern through a tenth contact hole, and the fourth connection pattern may be disposed on the plurality of second power lines and may be connected to the light emitting diode.

In an embodiment, the second initialization voltage may be provided from the second transmission line to the second active pattern through the sixth contact hole, may be provided from the second active pattern to the fourth connection pattern through the tenth contact hole, and may be provided from the fourth connection pattern to the light emitting diode.

In an embodiment, the display device may further include a plurality of first initialization transmission lines that provide the first initialization voltage to the plurality of first power lines, and are connected to the plurality of first power lines, and a plurality of second initialization transmission lines that provide the second initialization voltage to the plurality of second power lines, and are connected to the plurality of second power lines.

In an embodiment, the display device may further include a plurality of high power voltage lines that extend in the column direction, and are spaced apart from a data line of the plurality of data lines.

In an embodiment, the plurality of data lines and the plurality of high power voltage lines may be disposed on the plurality of first power lines and the plurality of second power lines.

In an embodiment, the plurality of first power lines and the plurality of second power lines may be disposed in a same layer, the plurality of first transmission lines and the plurality of second transmission lines may be disposed in a same layer, and the plurality of first transmission lines and the plurality of second transmission lines may be disposed on the plurality of first power lines and the plurality of second power lines.

A display device in an embodiment may include a substrate that includes a plurality of sub-pixel circuit areas that are arranged in first to m-th rows and first to n-th columns, where m is even number and n is odd number, a plurality of sub-pixel circuits disposed on the plurality of sub-pixel circuit areas, a plurality of first power lines that extend in a row direction, overlap with sub-pixel circuit areas in a k-th row among the first row to an m-th row among the plurality of sub-pixel circuit areas, and receive a first initialization voltage, where k is odd number between 1 to m, a plurality of second power lines that extend in the row direction, overlap with sub-pixel circuit areas in a (k+1)-th row among the plurality of sub-pixel circuit areas, and receive a second initialization voltage, a plurality of first transmission lines that extend in a column direction, overlap with sub-pixel circuit areas in a i-th column among the first column to an n-th column among the plurality of sub-pixel circuit areas, and provide the first initialization voltage to each of the sub-pixel circuits disposed on the k-th row and the (k+1)-th row, where i is odd number between 1 to n, a plurality of second transmission lines that extend in the column direction, overlap with sub-pixel circuit areas in a (i+1)-th column among the plurality of sub-pixel circuit areas, and provide the second initialization voltage to each of the plurality of sub-pixel circuits disposed on the k-th row and the (k+1)-th row and a plurality of light emitting diodes disposed on the plurality of sub-pixel circuits, the plurality of first power lines, the plurality of second power lines, the plurality of first transmission lines and the plurality of second transmission lines.

In an embodiment, the plurality of first power lines and the plurality of second power lines may be alternately arranged with each other, and the plurality of first transmission lines and the plurality of second transmission lines may be alternately arranged with each other.

In an embodiment, a first transmission line of the plurality of first transmission lines may be connected to a first power line of the plurality of first power lines through a first contact hole defined in a portion that the first power line and the first transmission line cross each other, and a second transmission line of the plurality of second transmission lines may be connected to a second power line of the plurality of second power lines through a second contact hole defined in a portion that the second power line and the second transmission line cross each other.

In an embodiment, the first contact hole may be defined in a sub-pixel circuit area in which the k-th row and the i-th column cross among the plurality of sub-pixel circuit areas, and the second contact hole may be defined in a sub-pixel circuit area in which the k-th row and the (i+1)-th column cross among the plurality of sub-pixel circuit areas.

In a display device in embodiments of the invention, only one power line may be disposed in sub-pixel circuit areas disposed in one row. Accordingly, a size of sub-pixel may be relatively decreased. Also, since the size of each sub-pixel is decreased, a number of the sub-pixels that may be disposed in the display device may relatively be increased. Accordingly, the display device according to the invention may have high resolution.

Since only one power line is disposed in the sub-pixel circuit areas disposed in one row, a density of the lines may be decreased so that defects may not occur in a manufacturing process of the display device. Also, resistance due to capacitance that is generated by overlapping the lines may be decreased. Accordingly, a scan on time ("SOT") of each of the sub-pixel may be sufficiently long.

BRIEF DESCRIPTION OF THE DRAWINGS

The above and other exemplary embodiments, advantages and features of this disclosure will become more apparent by describing in further detail exemplary embodiments thereof with reference to the accompanying drawings.

DETAILED DESCRIPTION

Figure 1:
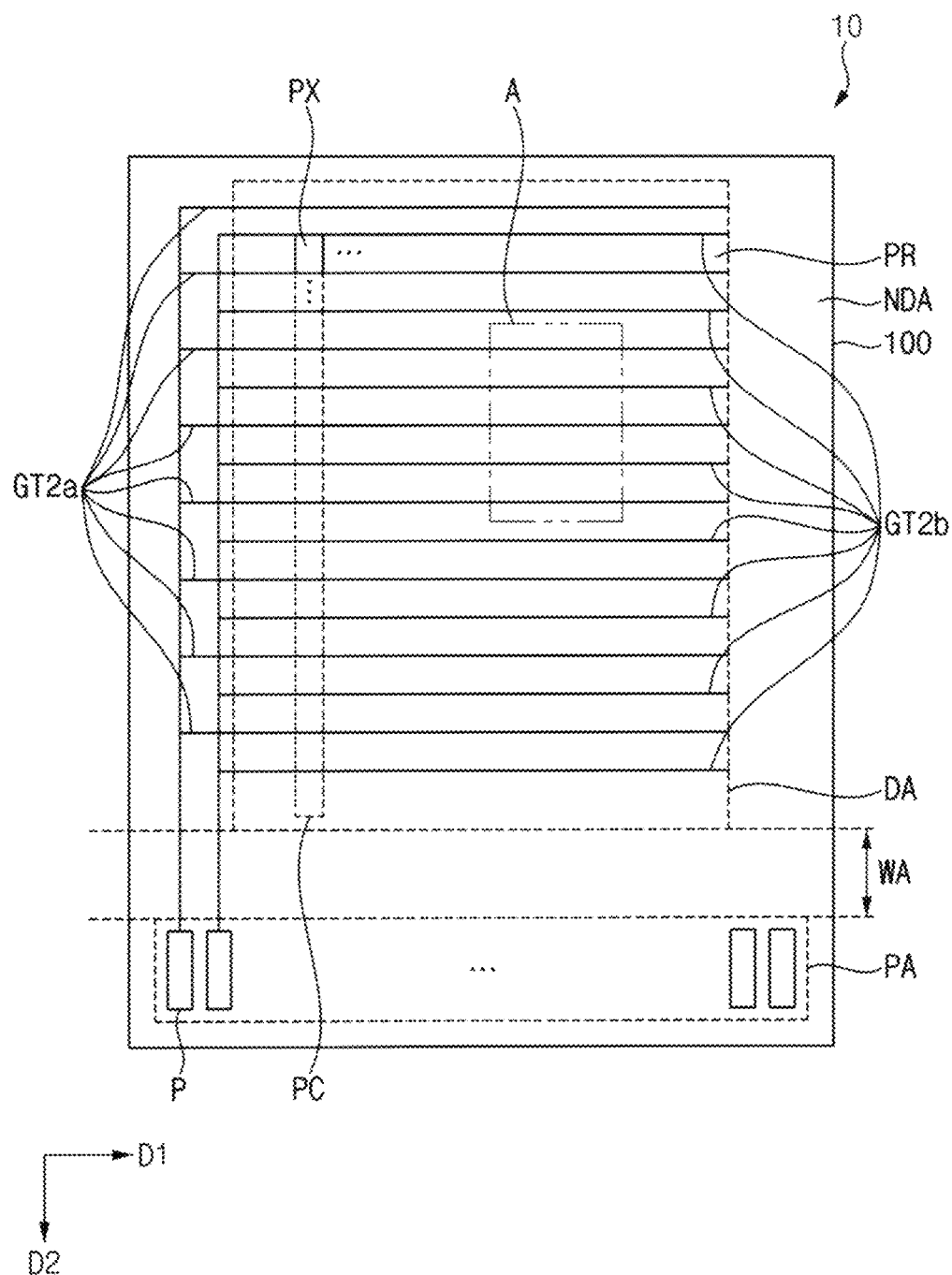
FIG. 1 is a plan view that illustrates an embodiment of a display device according to the invention.

Hereinafter, display devices in embodiments will be described in more detail with reference to the accompanying drawings. The same reference numerals are used for the same components in the drawings, and redundant descriptions of the same components will be omitted.

It will be understood that when an element is referred to as being "on" another element, it can be directly on the other element or intervening elements may be therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. In an embodiment, when the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, when the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). The term "about" can mean within one or more standard deviations, or within ±30%, 20%, 10%, 5% of the stated value, for example.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. In an embodiment, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

FIG. 1 is a plan view that illustrates an embodiment of a display device according to the invention.

Referring to FIG. 1, a display device 10 may include a display panel 100. The display panel 100 may include a display area DA and a non-display area NDA. A plurality of sub-pixels PX may be disposed in the display area DA, and the display area DA may display an image.

The sub-pixels PX may be arranged in a first direction D1 and a second direction D2 perpendicular to the first direction D1. That is, the sub-pixels PX may be arranged in a matrix form. Accordingly, the sub-pixels PX may be defined as a plurality of sub-pixel rows PR that extend in the first direction D1 and a plurality of sub-pixel columns PC that extend in the second direction D2. In an embodiment, the first direction D1 may be a row direction, and the second direction D2 may be a column direction, for example.

The non-display area NDA may be disposed around the display area DA and surround at least a portion of the display area DA. In an embodiment, the non-display area NDA may be an area that does not display an image, for example. In the embodiments, the non-display area NDA may correspond to a remaining area except for the display area DA on the display panel 100. The non-display area NDA may include a bending area, a wiring area WA, and a pad area PA.

The pad area PA may be disposed at one end portion (e.g., lower portion in FIG. 1) of the non-display area NDA, and a plurality of pads P may be disposed in the pad area PA. The pads P may be exposed without being covered by an insulation layer, and may be electrically connected to the flexible printed circuit board. A plurality of wirings that are electrically connected to the pads P may be disposed in the wiring area WA. The wirings are a gate line (e.g., the first gate line GT1a, the second gate line GT1b, and the third gate line GT1d of FIG. 5) and a data line (e.g., the data line SDd of FIG. 9), a high power voltage line (e.g., the high power voltage line SDc of FIG. 9), and etc.

The display panel 100 may further include a gate driver, a data driver, a light emission driver, etc. The gate driver, the data driver, and the light emission driver may be disposed in the non-display area NDA. Optionally, the data driver may be disposed (e.g., mounted) on the printed circuit board. The gate driver may generate gate signals based on a gate control signal that is provided from an external device. The gate driver may be electrically connected to the sub-pixels PX and may sequentially output the gate signals to the sub-pixels PX.

The data driver may generate a data signal based on a data control signal provided from the external device. The data driver may be electrically connected to the sub-pixels PX, and the data signals may be provided to the sub-pixels PX based on the gate signals.

The light emission driver may generate a light emission driving signal based on a light emission driving control signal provided from the external device. The light emission driver may be electrically connected to the sub-pixels PX and provide the light emission driving signal to the sub-pixels PX.

Figure 2:
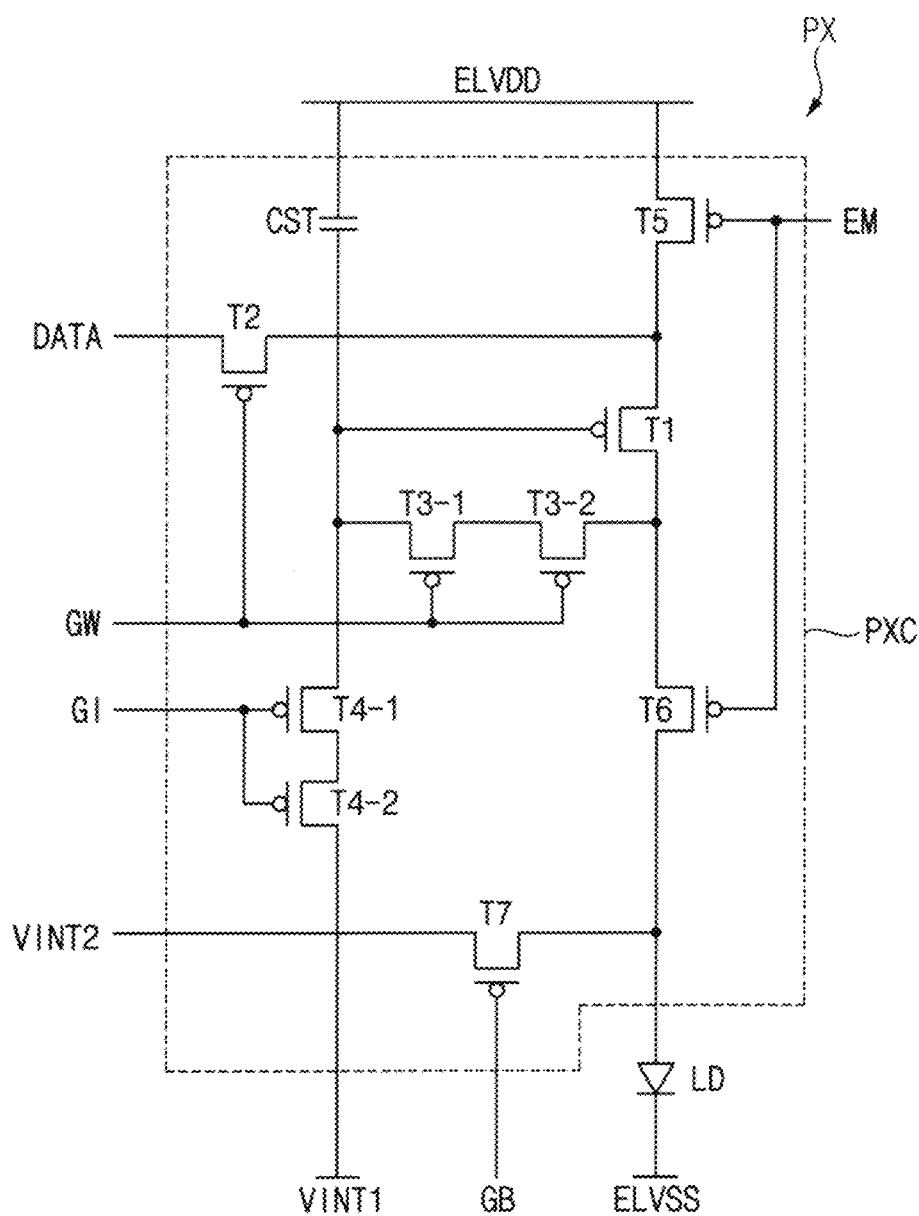
FIG. 2 is a circuit diagram that illustrates one sub-pixel that is included in the display device of FIG. 1.

Initialization power lines may extend in the first direction D1 that is a row direction, and may receive a first initialization voltage (the first initialization voltage VINT1 of FIG. 2) or a second initialization voltage (the second initialization voltage VINT2 of FIG. 2). The initialization power lines may include first power lines GT2a and second power lines GT2b. The first power lines GT2a may receive the first initialization voltage from a first pad among the pads P disposed in the pad area PA. The first power lines GT2a may provide the first initialization voltage to the sub-pixels PX of the display area DA.

The second power lines GT2b may receive the second initialization voltage from a second pad different from the first pad among the pads P disposed in the pad area PD. The second power lines GT2b may provide the second initialization voltage to the sub-pixels PX of the display area DA.

Each of the first power lines GT2a and the second power lines GT2b may correspond to each of the sub-pixel circuit areas. The first power lines GT2a and the second power lines GT2b may be alternately arranged with each other in the second direction D2. The first power line GT2a may be disposed one by one in every two sub-pixel rows PR. The second power line GT2b may be disposed one by one in every two sub-pixel rows PR. In detail, the first power line GT2a may be disposed in the sub-pixel circuit areas in odd rows (e.g., the first sub-pixel circuit area PXA1, the second sub-pixel circuit area PXA2, and the third sub-pixel circuit area PXA3 and the fourth sub-pixel circuit area PXA4 of FIG. 3). The second power line GT2b may be disposed in the sub-pixel circuit areas in even rows (e.g., the fifth sub-pixel circuit area PXA5, the sixth sub-pixel circuit area PXA6, and the seventh sub-pixel circuit area PXA7 and the eighth sub-pixel circuit area PXA8 of FIG. 3).

Each of the first transmission lines SDa and the second transmission lines SDb may correspond to each of the sub-pixel circuit areas. The first transmission lines SDa and the second transmission lines SDb may be alternately arranged with each other in the first direction D1. The first transmission line SDa may be disposed one by one in every two sub-pixel columns PC. The second transmission lines SDb may be disposed one by one in every the two sub-pixel columns PC. Specifically, the first transmission line SDa may be disposed in the sub-pixel circuit areas in odd columns (e.g., the first sub-pixel circuit area PXA1, the third sub-pixel circuit area PXA3, and the fifth sub-pixel circuit area PXA5 and the seventh sub-pixel circuit area PXA7 of FIG. 3). The second transmission line SDb may be disposed in the sub-pixel circuit areas in even columns (e.g., the second sub-pixel circuit area PXA2, the fourth sub-pixel circuit area PXA4, and the sixth sub-pixel circuit area PXA6 and the eighth sub-pixel circuit area PXA8 of FIG. 3).

The first power lines GT2a, the second power lines GT2b, the first transmission lines SDa, and the second transmission lines SDb will be described in detail below.

Figure 3:
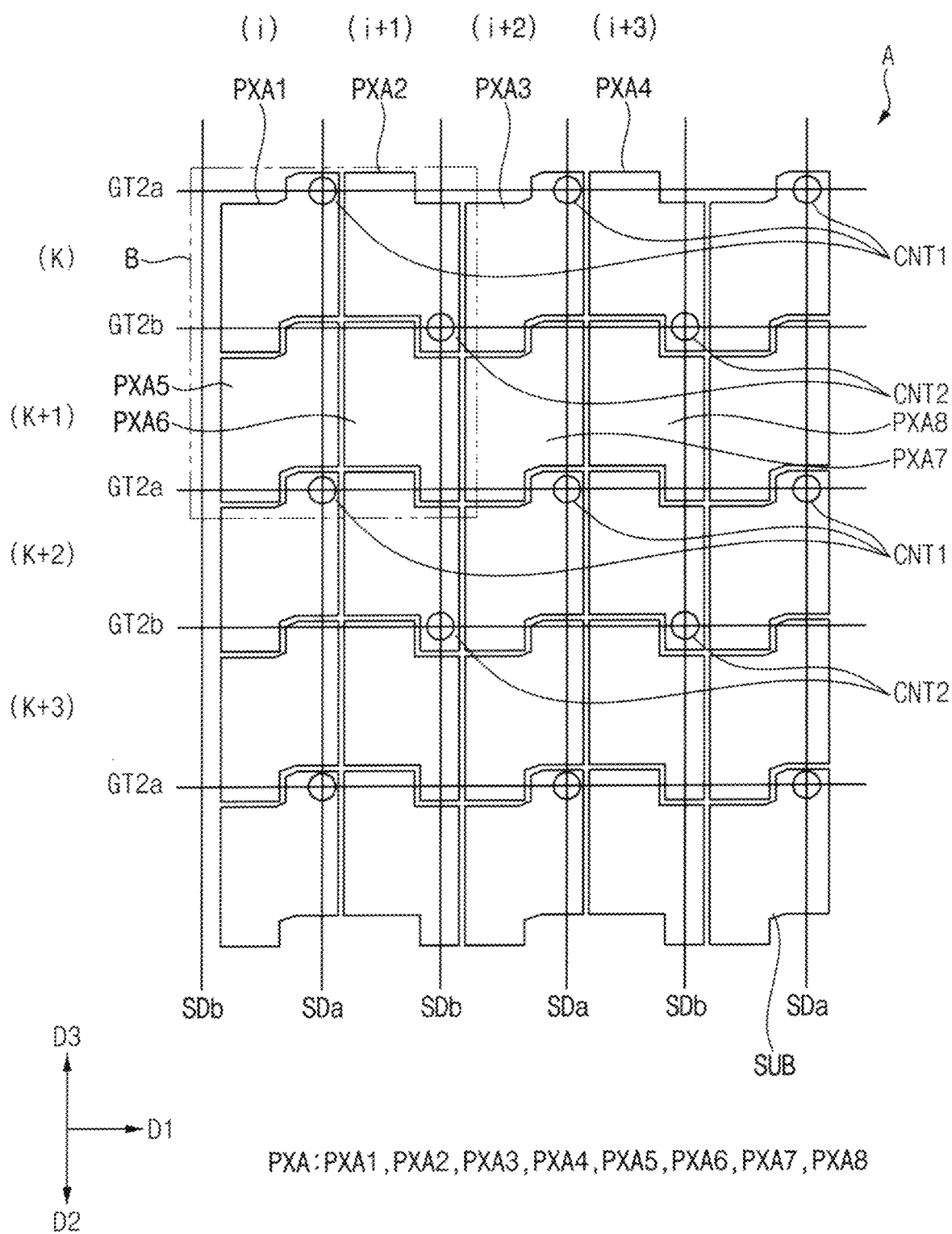
FIG. 3 is a plan view that illustrates an enlarged area A of FIG. 1.

FIG. 2 is a circuit diagram that illustrates one sub-pixel that is included in the display device of FIG. 1. FIG. 3 is a plan view that illustrates an enlarged area A of FIG. 1.

Referring to FIGS. 2 and 3, the sub-pixel PX may include a sub-pixel circuit PXC and a light emitting diode LD. The sub-pixel circuit PXC may be disposed in the sub-pixel circuit area PXA. The sub-pixel circuit PXC may include a plurality of transistors T1, T2, T3-1, T3-2, T4-1, T4-2, T5, T6, and T7 and a storage capacitor CST. The transistors T1, T2, T3-1, T3-2, T4-1, T4-2, T5, T6, and T7 may include a first transistor T1, a second transistor T2, third transistors T3-1 and T3-2, fourth transistors T4-1 and T4-2, a fifth transistor T5, a sixth transistor T6, and a seventh transistor T7.

The first transistor T1 may receive a power source voltage ELVDD, may be electrically connected to a first electrode of the light emitting diode LD, and may provide a driving current corresponding to a data signal DATA to the light emitting diode LD. In other words, the first transistor T1 may be a driving transistor.

The second transistor T2 may be connected between a line of the data signal DATA and a first electrode of the first transistor T1, and may provide the data signal DATA to the first transistor T1 in response to the gate signal GW. In other words, the second transistor T2 may be a switching transistor.

The third transistors T3-1 and T3-2 may be connected between a gate electrode and a second electrode of the first transistor T1, and may compensate a threshold voltage of the transistor T1 by diode-connecting the first transistor T1 in response to the gate signal GW. In other words, the third transistors T3-1 and T3-2 may be compensation transistors.

The third transistors T3-1 and T3-2 may include a first compensation transistor T3-1 and a second compensation transistor T3-2. The first compensation transistor T3-1 and the second compensation transistor T3-2 may be connected in series with each other. In other words, a gate electrode of the first compensation transistor T3-1 and a gate electrode of the second compensation transistor T3-2 may be connected to each other, and a second electrode of the first compensation transistor T3-1 and a first electrode of the second compensation transistor T3-1 may be connected to each other. However, the invention is not limited thereto, and the sub-pixel circuit PXC may include only one compensation transistor instead of the two third transistors T3-1 and T3-2. Further, in another embodiment, the sub-pixel circuit PXC may include at least three third transistors.

The fourth transistors T4-1 and T4-2 may be connected between a line of the first initialization voltage VINT1 and the gate electrode of the first transistor T1. The fourth transistors T4-1 and T4-2 may provide the first initialization voltage VINT1 to the gate electrode of the first transistor T1 in response to a first initialization control signal GI. In other words, the fourth transistors T4-1 and T4-2 may be driving initialization transistors.

The fourth transistors T4-1 and T4-2 may include a first driving initialization transistor T4-1 and a second driving initialization transistor T4-2. The first driving initialization transistor T4-1 and the second driving initialization transistor T4-2 may be connected in series with each other. In other words, a gate electrode of the first driving initialization transistor T4-1 and a gate electrode of the second driving initialization transistor T4-2 are connected to each other, and a second electrode of the first driving initialization transistor T4-1 and a first electrode of the second driving initialization transistor T4-2 may be connected to each other. However, the invention is not limited thereto, and the sub-pixel circuit PXC may include only one driving initialization transistor instead of the two fourth transistors T4-1 and T4-2. Further, in another embodiment, the sub-pixel circuit PXC may include at least three fourth transistors.

The fifth transistor T5 may be connected between a line of the high power voltage ELVDD (e.g., the high power voltage line SDc of FIG. 9) and the first electrode of the first transistor T1. The sixth transistor T6 may be connected between the second electrode of the first transistor T1 and the first electrode of the light emitting diode LD. Each of the fifth and sixth transistors T5 and T6 may provide the driving current corresponding to the data signal DATA to the first electrode of the light emitting diode LD in response to the light emitting driving signal EM. That is, each of the fifth transistor T5 and the sixth transistor T6 may be a light emission control transistor.

The seventh transistor T7 may be connected between a line of the second initialization voltage VINT2 (e.g., the second power line GT2b) and the first electrode of the light emitting diode LD, and may provide the second initialization voltage VINT2 to the first electrode of the light emitting diode LD in response to a second initialization control signal GB. In other words, the seventh transistor T7 may be a diode initialization transistor.

The storage capacitor CST may include a first electrode and a second electrode. The first electrode of the storage capacitor CST may be connected to the first transistor T1, and the second electrode of the storage capacitor CST may receive the high power voltage ELVDD.

Referring to FIGS. 1 to 3, in an embodiment, a substrate SUB may include a plurality of sub-pixel circuit areas PXA that is arranged in a plurality of first to m-th rows, where m is a positive integer, and a plurality of first to n-th columns, where n is a positive integer. In an embodiment, the sub-pixel circuit areas PXA may include first to eighth sub-pixel circuit areas PXA1, PXA2, PXA3, PXA4, PXA5, PXA6, PXA7, and PXA8. In an embodiment, the first to eighth sub-pixel circuit areas PXA1, PXA2, PXA3, PXA4, PXA5, PXA6, PXA7, and PXA8 may be repeatedly arranged in the first direction D1 and the second direction D2, for example. The sub-pixel row PR of FIG. 1 may be sub-pixel circuit areas PXA in one row among the sub-pixel circuit areas PXA in the first to m-th rows of FIG. 3. The sub-pixel column PC of FIG. 1 may be the sub-pixel circuit areas PXA in one column among the sub-pixel circuit areas PXA in the first to n-th columns of FIG. 3.

Figure 4:
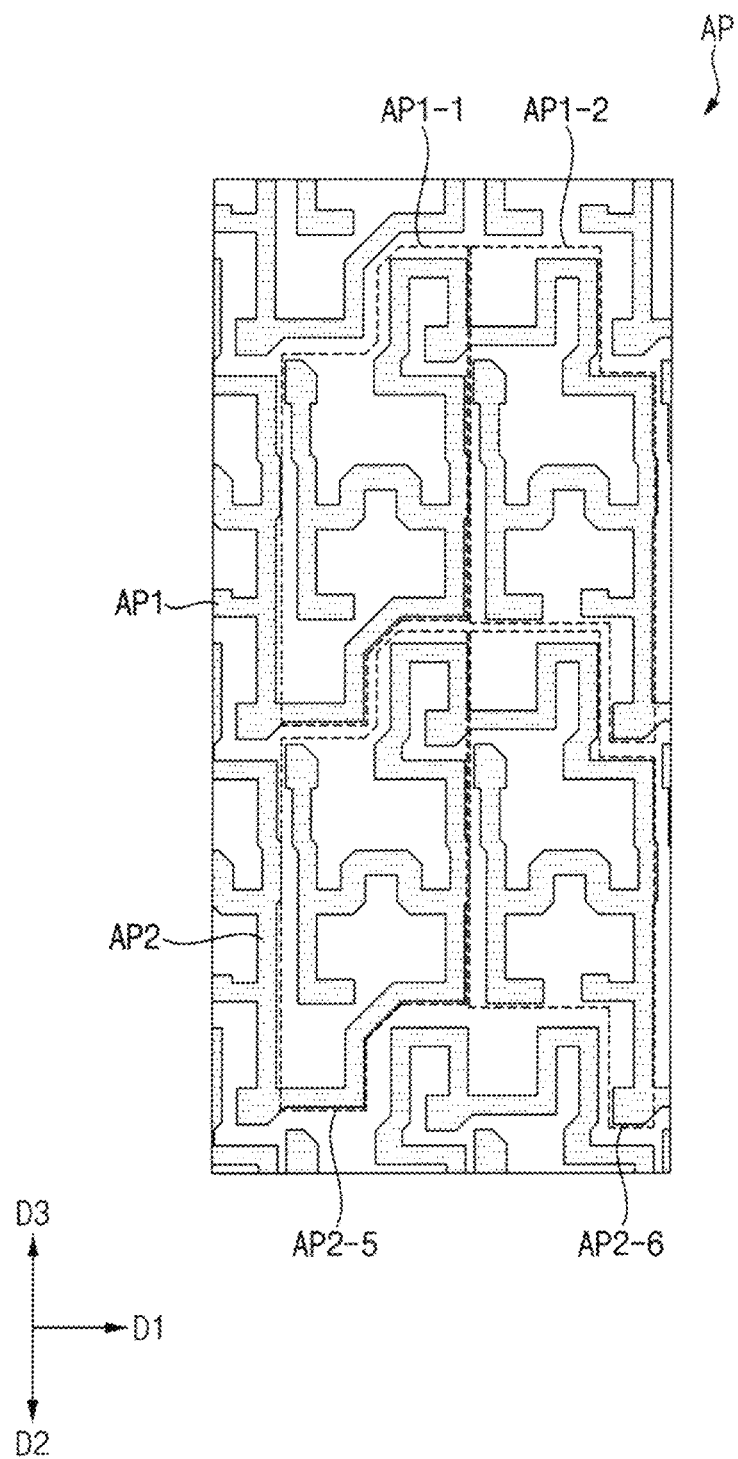
FIGS. 4 to 10 are plan views of area B of FIG. 3.

A shape of each of the sub-pixel circuit areas PXA may be determined according to a shape of the active pattern (e.g., the active patterns AP1 and AP2 of FIG. 4). Also, two sub-pixel circuit areas PXA adjacent in the first direction D1 among the sub-pixel circuit areas PXA may have different shapes. In an embodiment, each of the first sub-pixel circuit area PXA1 and the third sub-pixel circuit area PXA3 may have an identical shape, but the first sub-pixel circuit area PXA1 and the second sub-pixel circuit area PXA2 may have a different shape from each other, for example.

However, although the shape of each of the sub-pixel circuit areas PXA of FIG. 3 is illustrated as a polygonal shape, the shape of each of the sub-pixel circuit areas PXA is not limited thereto. In an embodiment, when a shape of the active pattern is changed, the shape of the sub-pixel circuit area PXA may also be changed to correspond to the shape of the active pattern, for example.

Each of the sub-pixel circuits PXC may be disposed in each of the first to eighth sub-pixel circuit areas PXA1, PXA2, PXA3, PXA4, PXA5, PXA6, PXA7, and PXA8. Accordingly, the first to eighth sub-pixel circuits PXC may be disposed in the first to eighth sub-pixel circuit areas PXA1, PXA2, PXA3, PXA4, PXA5, PXA6, PXA7, and PXA8, respectively. The second sub-pixel circuit area PXA2 may be disposed in the first direction D1 from the first sub-pixel circuit area PXA1, and the third sub-pixel circuit area PXA3 may be disposed in the first direction D1 from the second sub-pixel circuit area PXA2. The fourth sub-pixel circuit area PXA4 may be disposed in the first direction D1 from the third sub-pixel circuit area PXA3. The fifth sub-pixel circuit area PXA5 may be disposed in the second direction D2 from the first sub-pixel circuit area PXA1, and the sixth sub-pixel circuit area PXA6 may be disposed in the first direction D1 from the fifth sub-pixel circuit area PXA5. The seventh sub-pixel circuit area PXA7 may be disposed in the first direction D1 from the sixth sub-pixel circuit area PXA6, and the eighth sub-pixel circuit area PXA8 may be disposed in the first direction D1 from the seventh sub-pixel circuit area PXA7.

In an embodiment, among the sub-pixel circuit areas PXA arranged in first to m-th (where m is an even number) rows and first to n-th (where n is an even number) columns, the first sub-pixel circuit area PXA1 may be disposed in a k-th row (where k is an odd number between 1 to m) and a i-th column (where i is an odd number between 1 to n), and the second sub-pixel circuit area PXA2 may be disposed in the k-th row and a (i+1)-th column, the third sub-pixel circuit area PXA3 may be disposed in the k-th row and a (i+2)-th column, and the fourth sub-pixel circuit area PXA4 may be disposed in the k-th row and a (i+3)-th column, for example. Among the sub-pixel circuit areas PXA arranged in first to m-th rows and first to n-th columns, the fifth sub-pixel circuit area PXA5 may be disposed in a (k+1)-th row and the i-th column, and the sixth sub-pixel circuit area PXA6 may be disposed in the (k+1)-th row and the (i+1)-th column, and the seventh sub-pixel circuit area PXA7 may be disposed in the (k+1)-th row and the (i+2)-th column, and the eighth sub-pixel circuit area PXA8 may be disposed in the (k+1)-th row and the (i+3)-th column.

Also, the first to fourth sub-pixel circuit areas PXA1, PXA2, PXA3, and PXA4 may correspond to the sub-pixel circuit areas PXA1, PXA2, PXA3, and PXA4 in the k-th row, and the fifth to eighth sub-pixel circuit areas PXA5, PXA6, PXA7, and PXA8 may correspond to the sub-pixel circuit areas PXA5, PXA6, PXA7, and PXA8 in the (k+1)-th row. The first and fifth sub-pixel areas PXA1 and PXA5 may correspond to the sub-pixel circuit areas PXA1 and PXA5 in the i-th column, and the second and sixth sub-pixel areas PXA2 and PXA6 may correspond to the sub-pixel circuit areas PXA2 and PXA6 in the (i+1)-th column, and the third and seventh sub-pixel areas PXA3 and PXA7 may correspond to the sub-pixel circuit areas PXA3 and PXA7 in the (i+2)-th column, and the fourth and eighth sub-pixel areas PXA4 and PXA8 may correspond to the sub-pixel circuit areas PXA4 and PXA8 in the (i+3)-th column.

Also, the sub-pixel circuit areas PXA in the k-th row and the (k+2)-th row may correspond to the sub-pixel circuit areas PXA in an odd row. The sub-pixel circuit areas PXA in the (k+1)-th row and the (k+3)-th row may correspond to the sub-pixel circuit areas PXA of an even row. Similarly, the sub-pixel circuit areas PXA in the i-th column and the (i+2)-th column may correspond to the sub-pixel circuit areas PXA in an odd column, and the sub-pixel circuit areas PXA in the (i+1)-th column and the (i+3)-th column may correspond to the sub-pixel circuit areas PXA in an even column.

Furthermore, the sub-pixel circuit areas PXA1, PXA2, PXA3, and PXA4 in the k-th row may be identical to the sub-pixel circuit areas PXA in the (k+2)-th row. Also, the sub-pixel circuit areas PXA5, PXA6, PXA7, and PXA8 in the (k+1)-th row may be identical to the sub-pixel circuit areas PXA in the (k+3)-th row. Similarly, the sub-pixel circuit areas PXA1 and PXA5 in the i-th column may be identical to the sub-pixel circuit areas PXA3 and PXA7 in the (i+2)-th column, and the sub-pixel circuit areas PXA2, PXA6 in the (i+1)-th column may be identical to the sub-pixel circuit areas PXA4 and PXA8 of the (i+3)-th column.

That is, the sub-pixel circuit areas PXA may include a structure that the sub-pixel circuit area PXA1 in the k-th row and the i-th column, the sub-pixel circuit area PXA2 in the k-th row and the (i+1)-th column, the sub-pixel circuit area PXA5 in the (k+1)-th row and i-th column and the sub-pixel circuit area PXA6 in the (k+1)-th row and the (i+1)-th column are repeated along the first direction D1 and the second direction D2. Accordingly, in the description of the third, fourth, seventh, and eighth sub-pixel areas PXA3, PXA4, PXA7, and PXA8, which will be described later, a portion that is identical to the description of the first, second, fifth, and sixth sub-pixel circuit areas PXA1, PXA2, PXA5, and PXA6 may be omitted.

Each of the first to eighth sub-pixel circuits PXC may include the transistors T1, T2, T3-1, T3-2, T4-1, T4-2, T5, T6, and T7 and the storage capacitor CST. That is, the transistors T1, T2, T3-1, T3-2, T4-1, T4-2, T5, T6, and T7 and the storage capacitor CST may be disposed in each of the first to eighth sub-pixel circuit areas PXA1, PXA2, PXA3, PXA4, PXA5, PXA6, PXA7, and PXA8.

Figure 5:
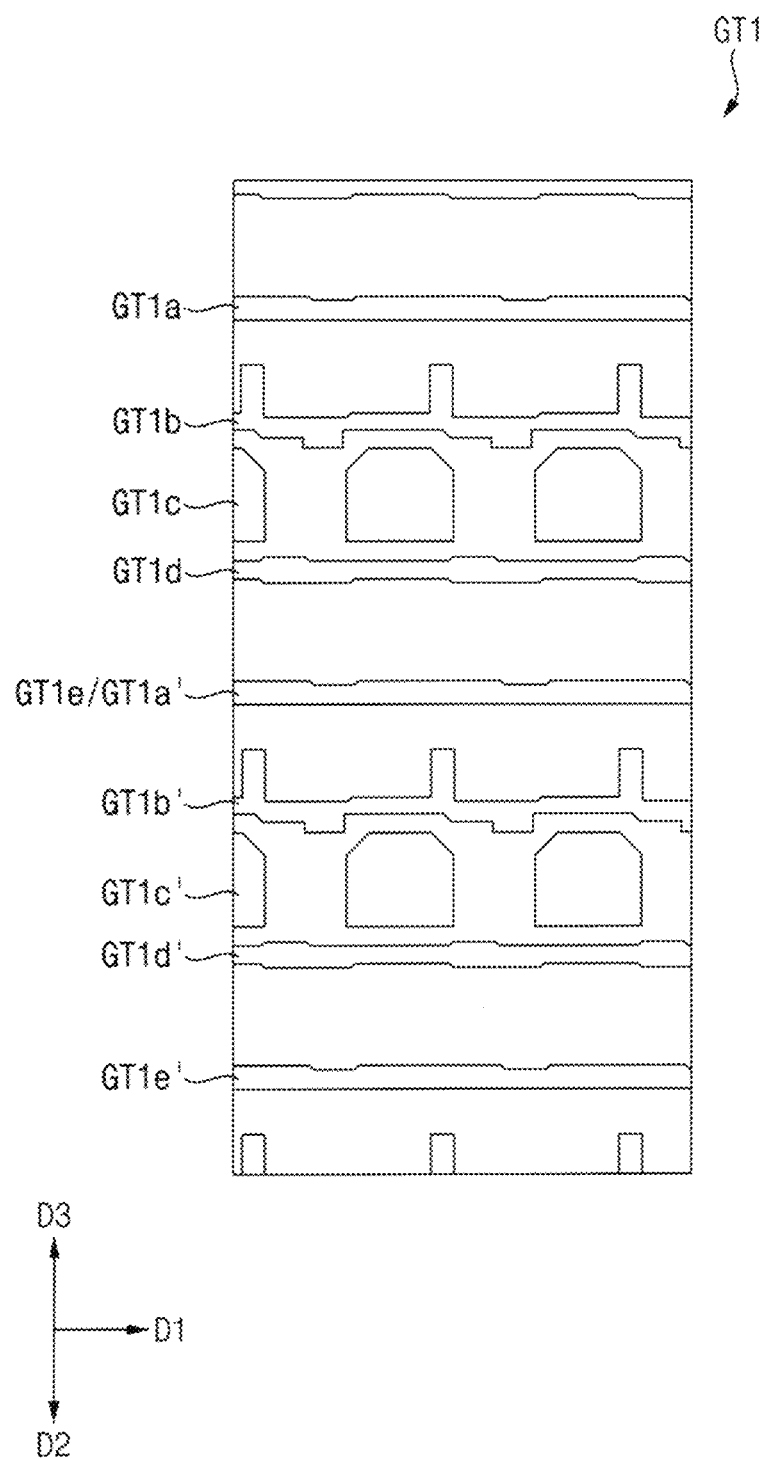

The sub-pixel circuits PXC may be connected to gate lines that extend in the first direction D1 (e.g., a first gate line GT1a, a second gate line GT1b, and a third gate line GT1d of FIG. 5), data lines that extend in the second direction D2 (e.g., data line SDd of FIG. 9), and transmission lines SDa and SDb. Also, the initialization power lines that provide initialization voltages VINT1 and VINT2 to the sub-pixel circuits PXC may be connected to the sub-pixel circuits PXC.

The first power lines GT2a and the second power lines GT2b may extend in the first direction D1. The first power lines GT2a and the second power lines GT2b may be disposed in one side of the second gate lines GT1b and GT1b'. That is, the first power lines GT2a and the second power lines GT2b, and the gate lines GT1a, GT1b, GT1d, and GT1e may be disposed at different levels (e.g., in different layers), but may extend in the first direction D1. Each of the first power lines GT2a and the second power lines GT2b may correspond to each of the sub-pixel circuit areas PXA. The first power lines GT2a and the second power lines GT2b may be alternately arranged with each other in the second direction D2.

In an embodiment, the first power line GT2a may be disposed in the sub-pixel circuit areas PXA1, PXA2, PXA3, and PXA4 in the odd rows, for example. Specifically, the first power line GT2a may overlap the sub-pixel circuit areas PXA1, PXA2, PXA3, and PXA4 in the k-th row. The first power line GT2a may partially overlap with a portion that protrudes in a third direction D3 opposite to the second direction D2 among the sub-pixel circuit areas PXA1, PXA2, PXA3, and PXA4 in the k-th row. Accordingly, the first power line GT2a may overlap each of the first to fourth sub-pixel circuit areas PXA1, PXA2, PXA3, and PXA4 arranged in the odd rows.

The second power line GT2b may be disposed in the sub-pixel circuit areas PXA5, PXA6, PXA7, and PXA8 in the even rows. Specifically, the second power line GT2b may overlap the sub-pixel circuit areas PXA5, PXA6, PXA7, and PXA8 in the (k+1)-th row. The second power line GT2b may partially overlap with a portion that protrudes in the third direction D3 among the sub-pixel circuit areas PXA5, PXA6, PXA7, and PXA8 in the (k+1)-th row. The second power line GT2b may overlap each of the fifth to eighth sub-pixel circuit areas PXA5, PXA6, PXA7, and PXA8.

Referring back to FIGS. 2 and 3, the first initialization voltage VINT1 may be provided to the first power lines GT2a, and the first initialization voltage VINT1 provided to the first power lines GT2a may be identical to the first initialization voltage VINT1 of FIG. 2. Also, the second initialization voltage VINT2 may be provided to the second power lines GT2b, and the second initialization voltage VINT2 provided to the second power lines GT2b may be identical to the second initialization voltage VINT2 of FIG. 2.

The first initialization voltage VINT1 may be a voltage that initializes the first transistor T1. Specifically, during a period in which the fourth transistors T4-1 and T4-2 is turned on by the first initialization control signal GI, the first initialization voltage VINT1 may be provided to a gate terminal of the first transistor T1. Accordingly, the fourth transistors T4-1 and T4-2 may initialize a gate terminal of the first transistor T1 by the first initialization voltage VINT1.

The second initialization voltage VINT2 may be a voltage that initializes the light emitting diode LD. Specifically, the gate terminal of the seventh transistor T7 may receive the second initialization control signal GB. A first terminal of the seventh transistor T7 may receive the second initialization voltage VINT2. A second terminal of the seventh transistor T7 may be connected to a first terminal of the light emitting diode LD. When the seventh transistor T7 is turned on in response to the second initialization control signal GB, the seventh transistor T7 may provide the second initialization voltage VINT2 to the light emitting diode LD. Accordingly, the seventh transistor T7 may initialize the first terminal of the light emitting diode LD by the second initialization voltage VINT2.

The transmission lines may extend in the second direction D2 that is a column direction, and may receive the first initialization voltage VINT1 or the second initialization voltage VINT2 from the initialization power lines. The transmission lines may include the first transmission line SDa and the second transmission line SDb. The first transmission lines SDa and the second transmission lines SDb may extend in the second direction D2. The first transmission lines SDa and the second transmission lines SDb may be disposed in one side of the data lines SDd. That is, the first transmission lines SDa and the second transmission lines SDb are disposed on a same level (e.g., in a same layer) as the data lines SDd, and both may extend in the second direction D2. However, the invention is not limited thereto. The first transmission lines SDa and the second transmission lines SDb may be disposed in different levels from the data lines SDd. In an embodiment, the data lines SDd may be disposed on the first transmission lines SDa and the second transmission lines SDb. An insulation layer may be disposed between the data lines SDd, and the first transmission lines SDa and the second transmission lines SDb, for example. Similarly, in another embodiment, the data lines SDd may be disposed below the first transmission lines SDa and the second transmission lines SDb.

Each of the first transmission lines SDa and the second transmission lines SDb may correspond to each of the sub-pixel circuit areas PXA. The first transmission lines SDa and the second transmission lines SDb may be alternately arranged with each other in the first direction D1.

In an embodiment, the first transmission line SDa may be disposed on the sub-pixel circuit areas PXA1, PXA3, PXA5, and PXA7 in the odd columns, for example. Specifically, the first transmission line SDa may overlap the sub-pixel circuit areas PXA1 and PXA5 in the i-th column. Accordingly, the first transmission line SDa may overlap each of the first, third, fifth, and seventh sub-pixel circuit areas PXA1, PXA3, PXA5, and PXA7 arranged in the odd columns.

The second transmission line SDb may be disposed on the sub-pixel circuit areas PXA2, PXA4, PXA6, and PXA8 in the even columns. Specifically, the second transmission line SDb may overlap the sub-pixel circuit areas PXA2 and PXA6 in the (i+1)-th column. The second transmission line SDb may overlap each of the second, fourth, sixth, and eighth sub-pixel circuit areas PXA2, PXA4, PXA6, and PXA8 arranged in the even columns.

The first transmission line SDa may contact the first power line GT2a. The first contact hole CNT1 may be defined in a portion that the first power line GT2a and the first transmission line SDa cross each other. The first transmission line SDa may be connected to the first power line GT2a through the first contact hole CNT1. The second transmission line SDb may contact the second power line GT2b. The second contact hole CNT2 may be defined in a portion that the second power line GT2b and the second transmission line SDb cross each other. The second transmission line SDb may be connected to the second power line GT2b through the second contact hole CNT2.

The first transmission line SDa may receive the first initialization voltage VINT1 from the first power line GT2a. The second transmission line SDb may receive the second initialization voltage VINT2 from the second power line GT2b. The first transmission line SDa may provide the first initialization voltage VINT1 to the sub-pixel circuits PXC. The second transmission line SDb may provide the second initialization voltage VINT2 to the sub-pixel circuits PXC. That is, the first initialization voltage VINT1 provided to the first power line GT2a may be respectively provided to the sub-pixel circuits PXC through the first transmission line SDa. Similarly, the second initialization voltage VINT2 provided to the second power line GT2b may be respectively provided to the sub-pixel circuits PXC through the second transmission line SDb.

The first power line GT2a and the second transmission line SDb may not contact each other. The second power line GT2b and the first transmission line SDa may not contact each other. Accordingly, the first initialization voltage VINT1 and the second initialization voltage VINT2 may be applied electrically separately from each other.

The first contact holes CNT1 may be defined in the sub-pixel circuit areas PXA1 and PXA3 in which the odd rows and the odd columns intersect among the sub-pixel circuit areas PXA. That is, each of the first contact holes CNT1 may be defined in the sub-pixel circuit area PXA1 in which the k-th row and the i-th column intersect, and the sub-pixel circuit area PXA3 in which the k-th row and the (i+2)-th column intersect among the sub-pixel circuit areas PXA. In an embodiment, each of the first contact holes CNT1 may be respectively defined in the first sub-pixel circuit area PXA1 and the third sub-pixel circuit area PXA3, for example.

The second contact holes CNT2 may be defined in the sub-pixel circuit areas PXA2 and PXA4 where the odd rows and the even columns intersect among the sub-pixel circuit areas PXA. That is, each of the second contact holes CNT2 may be respectively defined in the sub-pixel circuit area PXA2 in which the k-th row and the (i+1)-th column intersect, and the sub-pixel circuit area PXA4 in which the k-th row and the (i+3) column intersect among the sub-pixel circuit areas PXA. In an embodiment, each of the second contact holes CNT2 may be respectively defined in the second sub-pixel circuit area PXA2 and the fourth sub-pixel circuit area PXA4, for example.

The first contact holes CNT1 and the second contact holes CNT2 may be defined in the sub-pixel circuit areas PXA1, PXA2, PXA3, and PXA4 in the odd row (e.g., the k-th row and the (k+2)-th row). The first contact holes CNT1 and the second contact holes CNT2 may not be defined in the sub-pixel circuit areas PXA5, PXA6, PXA7, and PXA8 in the even row (e.g., the (k+1)-th row and (k+3)-th row).

However, the invention is not limited thereto, and in other embodiments, the first transmission line SDa may be disposed in the sub-pixel circuit areas in the even column (e.g., the second sub-pixel circuit area PXA2, the fourth sub-pixel circuit area PXA4, the sixth sub-pixel circuit area PXA6, and the eighth sub-pixel circuit area PXA8 of FIG. 3). In addition, the second transmission line SDb may be disposed in the sub-pixel circuit areas in the odd column (e.g., the first sub-pixel circuit area PXA1, the third sub-pixel circuit area PXA3, and the fifth sub-pixel circuit area PXA5 and the seventh sub-pixel circuit area PXA7 of FIG. 3).

Accordingly, the first contact holes CNT1 defined in a portion in which the first power line GT2a and the first transmission line SDa cross each other may be respectively disposed in the sixth sub-pixel circuit area PXA6 and the eighth sub-pixel circuit area PXA5. Similarly, the second contact holes CNT2 defined in a portion in which the second power line GT2b and the second transmission line SDb cross each other may be respectively disposed in the fifth sub-pixel circuit area PXA5 and the seventh sub-pixel circuit area PXA7.

However, hereinafter, the description may be based on an embodiment in which the first transmission line SDa is disposed in the sub-pixel circuit areas in the odd column and the second transmission line SDb is disposed in the sub-pixel circuit areas in the even column.

Figure 9:
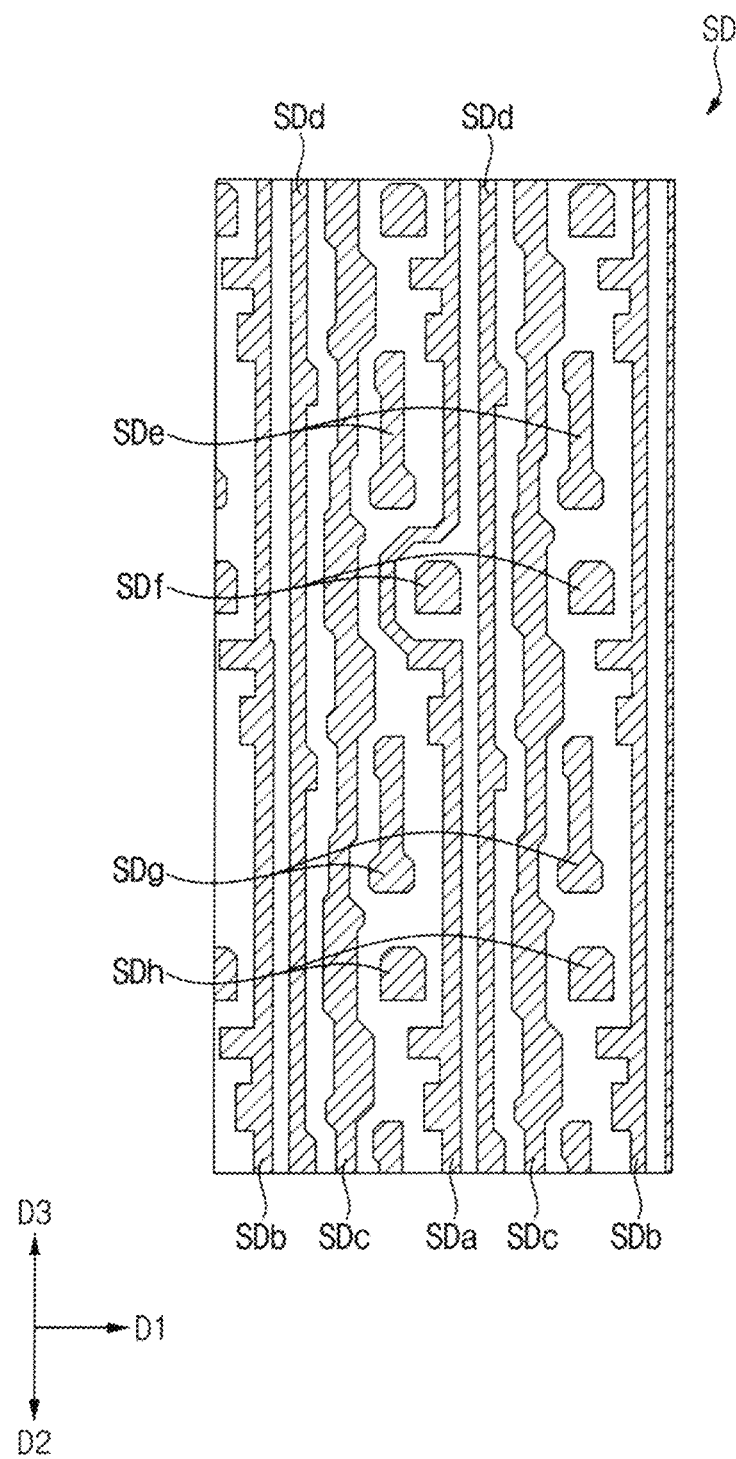
Figure 10:
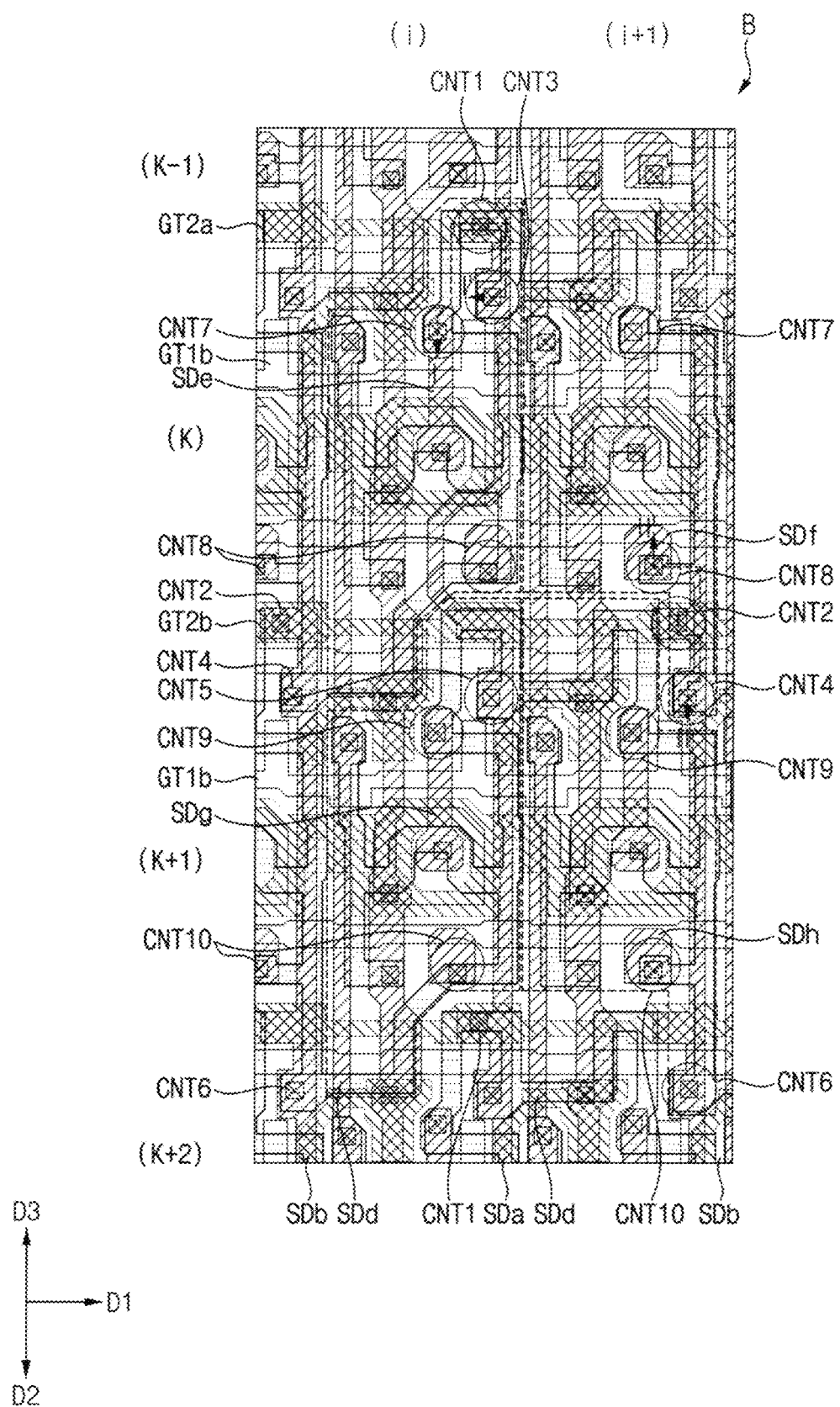
Figure 11:
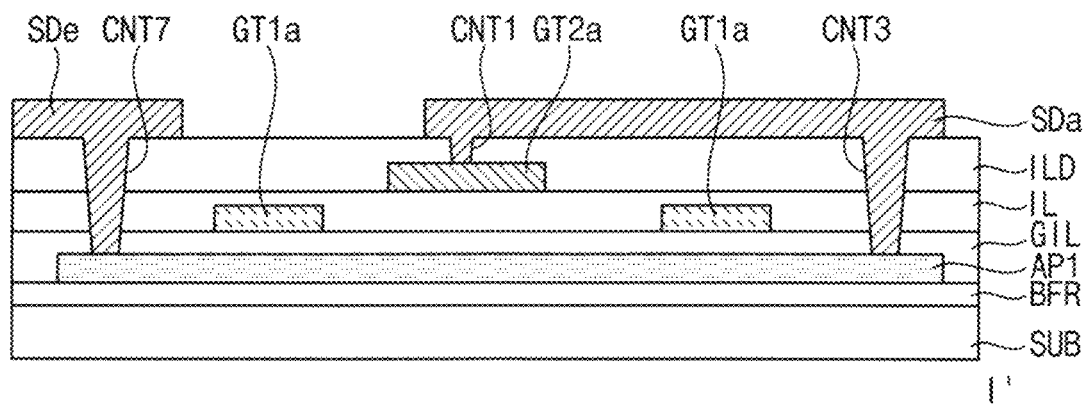
FIG. 11 is a cross-sectional view that illustrates the display device taken along line I-I' of FIG. 10.
Figure 12:
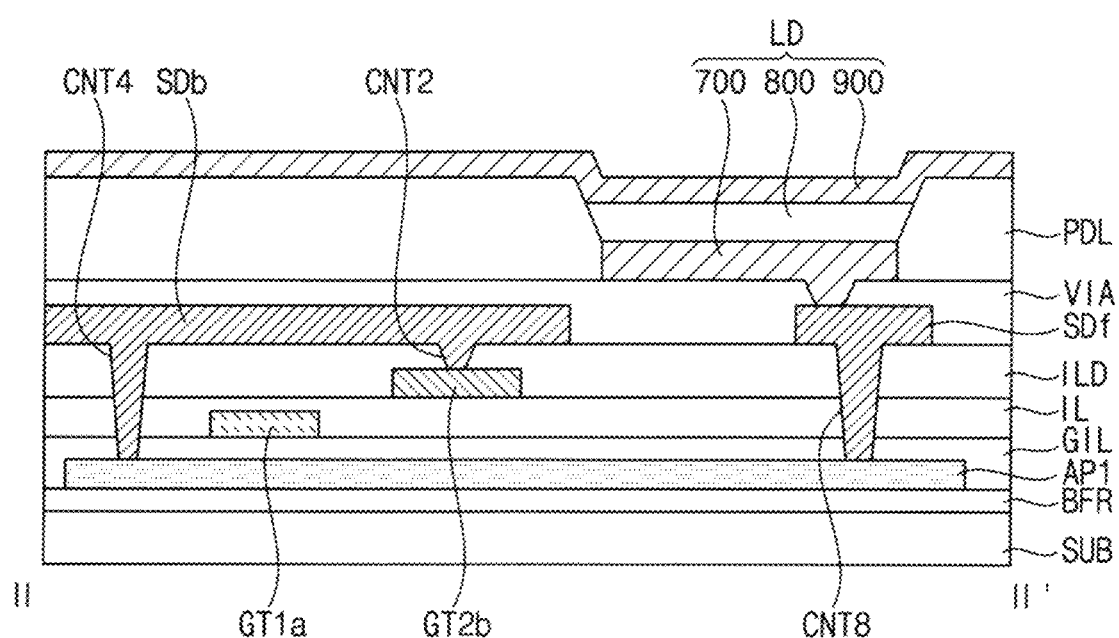
FIG. 12 is a cross-sectional view that illustrates the display device taken along line II-II' of FIG. 10.

FIGS. 4 to 10 are plan views of area B of FIG. 3. FIG. 11 is a cross-sectional view that illustrates the display device taken along line I-I' of FIG. 10. FIG. 12 is a cross-sectional view that illustrates the display device taken along line II-II' of FIG. 10.

Figure 6:
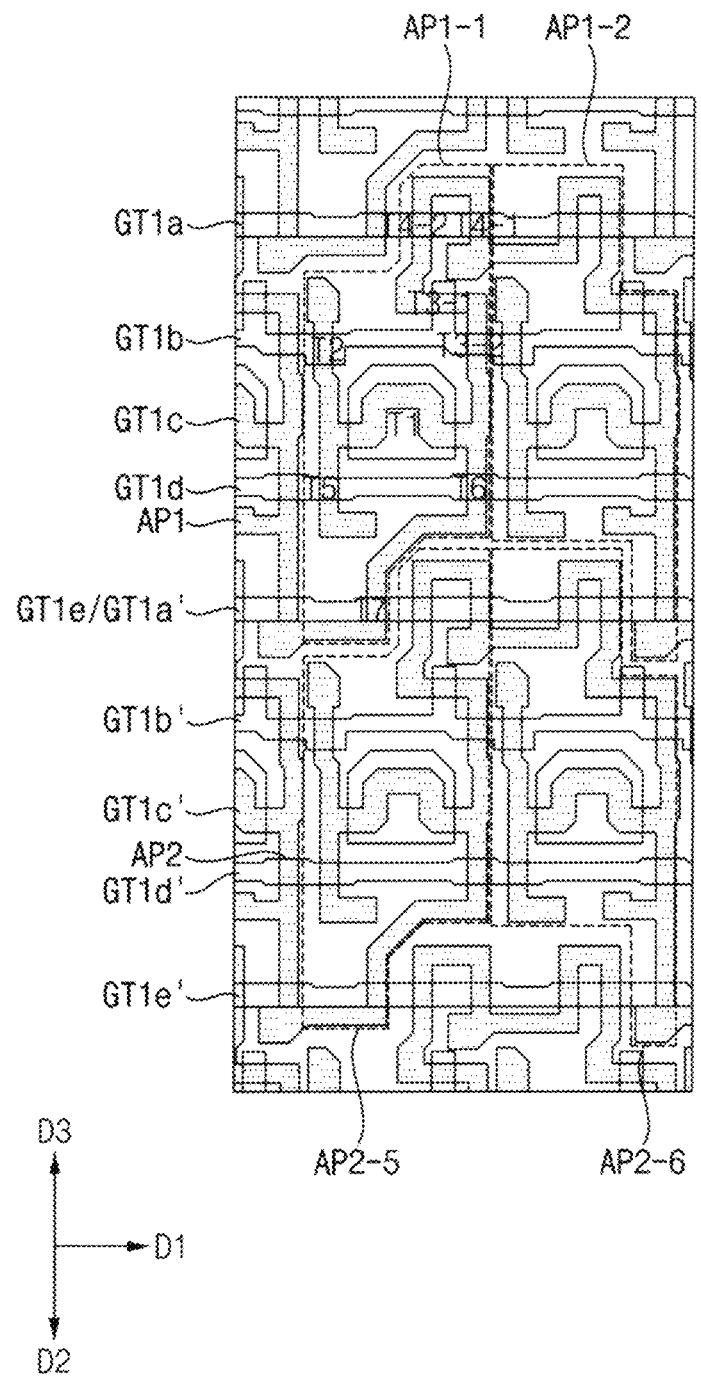
Figure 7:
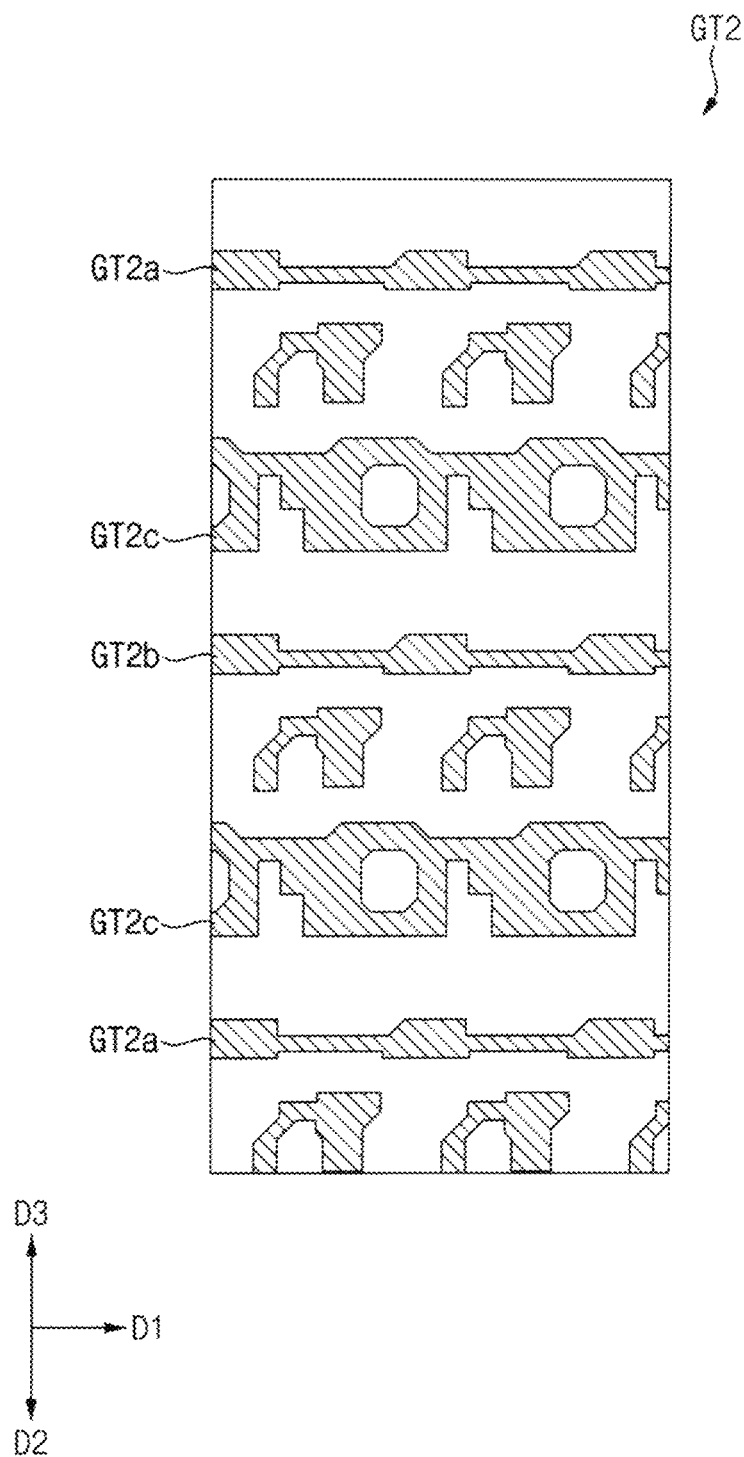
Figure 8:
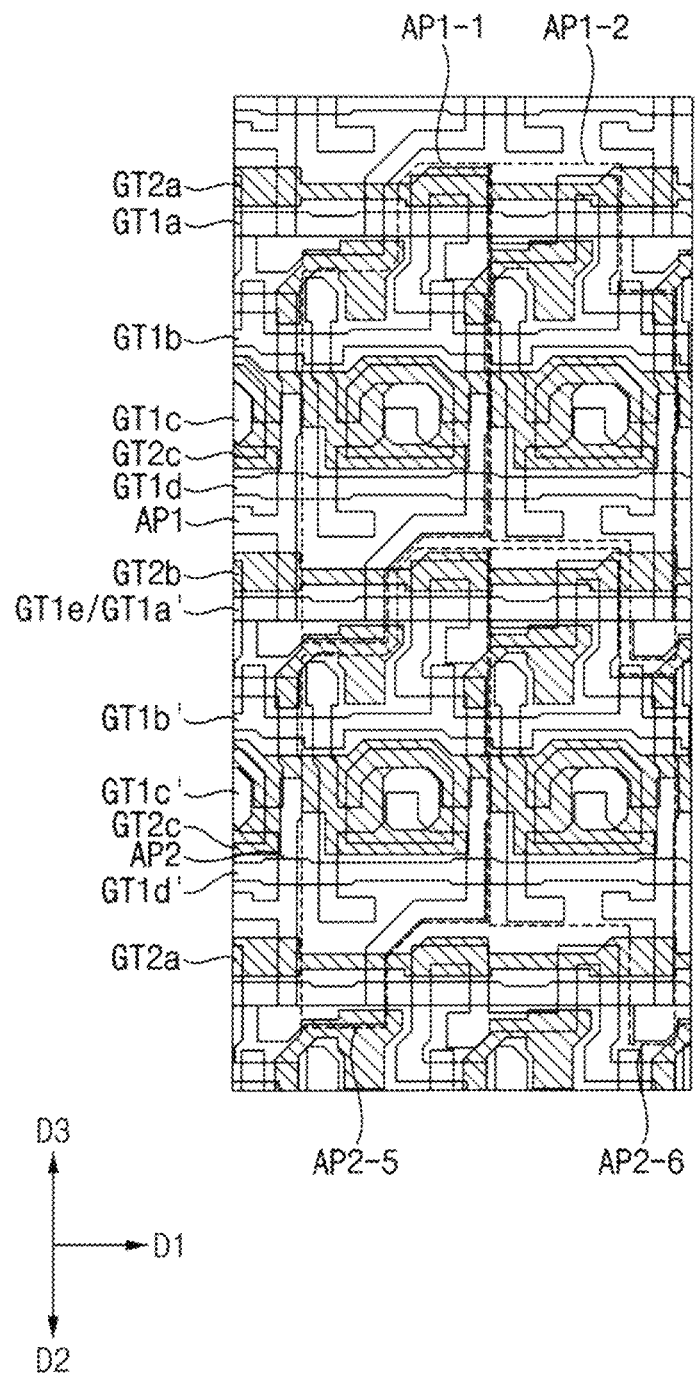

In an embodiment, FIG. 4 is a plan view that illustrates only the active layer AP of area B of FIG. 3, for example. FIG. 5 is a plan view that illustrates only the gate layer GT1 of area B of FIG. 3. FIG. 6 is a plan view that illustrates the active layer AP of FIG. 4 and the gate layer GT1 of FIG. 5. FIG. 7 is a plan view that illustrates only the first conductive layer GT2 in area B of FIG. 3. FIG. 8 is a plan view that illustrates the active layer AP of FIG. 4, the gate layer GT1 of FIG. 5, and the first conductive layer GT2 of FIG. 7. FIG. 9 is a plan view that illustrates only the second conductive layer SD of area B of FIG. 3. FIG. 10 is a plan view that illustrates the active layer AP of FIG. 4, the gate layer GT1 of FIG. 5, the first conductive layer GT2 of FIG. 7, and the second conductive layer SD of FIG. 9. FIG. 11 may be a cross-sectional view that illustrates configurations related to a process in which the first initialization voltage VINT1 is provided to the sub-pixel circuit PXC disposed in the first sub-pixel circuit area PXA1. FIG. 12 may be a cross-sectional view that illustrates configurations related to a process in which the second initialization voltage VINT2 is provided to the light emitting diode LD disposed in the second sub-pixel circuit area PXA2.

FIGS. 3 to 12, the display device 10 may include a substrate SUB, a buffer layer BFR, an active layer AP, a gate insulation layer GIL, a gate layer GT1, an insulation layer IL, a first conductive layer GT2, an inter-insulation layer ILD, a second conductive layer SD, a via-insulation layer VIA, a first electrode 700, a pixel defining layer PDL, a light emitting layer 800 and a second electrode 900.

Referring back to FIGS. 11 and 12, the substrate SUB may include a transparent or opaque material. The substrate SUB may include a flexible transparent resin substrate. In an embodiment, the transparent resin substrate may be a polyimide substrate, for example. Optionally, the substrate SUB may include a quartz substrate, a synthetic quartz substrate, a calcium fluoride substrate, a fluorine-doped quartz substrate, a soda lime glass substrate, or a non-alkali glass substrate, etc. The substrate SUB may include a barrier. The substrate SUB may have a multilayer structure in which the barrier layer and the polyimide substrate are alternately stacked. The barrier layer may prevent moisture from penetrating into the polyimide substrate.

The buffer layer BFR may be disposed on the substrate SUB. The buffer layer BFR may prevent diffusion of metal atoms or impurities from the substrate SUB to the active layer AP. In addition, the buffer layer BFR may control a heat transfer rate in a crystallization process for forming the active layer AP. Accordingly, a substantially uniform active layer AP may be formed or provided.

Referring back to FIGS. 4, 11 and 12, the active layer AP may be disposed on the buffer layer BFR. In an embodiment, the active layer AP may include polycrystalline silicon. In another embodiment, the active layer AP may include an oxide semiconductor. In an embodiment, the oxide semiconductor may include at least one of oxide among indium (In), gallium (Ga), tin (Sn), zirconium (Zr), vanadium (V), hafnium (Hf), cadmium (Cd), germanium (Ge), chromium (Cr), titanium (Ti), and zinc (Zn), for example.

The active layer AP may include a plurality of active patterns. In detail, the active layer AP may include a first active pattern AP1 and a second active pattern AP2. The first active pattern AP1 and the second active pattern AP2 may respectively correspond to the sub-pixel circuit areas PXA. In an embodiment, the first active pattern AP1 may be disposed in each of the sub-pixel circuit areas (e.g., the first to fourth sub-pixel circuit areas PXA1, PXA2, PXA3, and PXA4) in the odd rows among the sub-pixel circuit areas PXA (refer to FIG. 3), for example. The second active pattern AP2 may be disposed in each of the sub-pixel circuit areas (e.g., the fifth to eighth sub-pixel circuit areas PXA5, PXA6, PXA7, and PXA8) in the even rows among the sub-pixel circuit areas PXA (refer to FIG. 3).

In an embodiment, as illustrated in FIGS. 3 and 4, a portion of the first active pattern AP1 disposed in the first sub-pixel circuit area PXA1 may be a first active pattern AP1-1 disposed in the sub-pixel circuit area PXA1 in the k-th row and the i-th column among the first active pattern AP1, for example. A portion of the first active pattern AP1 disposed in the second sub-pixel circuit area PXA2 may be a first active pattern AP1-2 disposed in the second sub-pixel circuit area PXA2 in the k-th row and the (i+1)-th column among the first active pattern AP1. A portion of the second active pattern AP2 disposed in the fifth sub-pixel circuit area PXA5 may be a second active pattern AP2-5 disposed in the sub-pixel circuit area PXA5 in the (k+1)-th row and the i-th column among the second active pattern AP2. A portion of the second active pattern AP2 disposed in the sixth sub-pixel circuit area PXA6 may be a second active pattern AP2-6 disposed in the sub-pixel circuit area PXA6 in the (k+1)-th row and the (i+1)-th column among the second active pattern AP2.

Similarly, although not illustrated in the drawing, a portion of the first active pattern AP1 disposed in the third sub-pixel circuit area PXA3 may be a first active pattern AP1-3 disposed in the sub-pixel circuit area PXA3 in the k-th row and the (i+2)-th column among the first active pattern AP1. A portion of the first active pattern AP1 disposed in the fourth sub-pixel circuit area PXA4 may be a first active pattern AP1-4 disposed in the sub-pixel circuit area PXA4 in the k-th row and the (i+3)-th column among the first active pattern AP1. A portion of the second active pattern AP2 disposed in the seventh sub-pixel circuit area PXA7 may be a second active pattern AP2-7 disposed in the sub-pixel circuit area PXA7 in the (k+1)-th row and the (i+2)-th column among the second active pattern AP2. A portion of the second active pattern AP2 disposed in the eighth sub-pixel circuit area PXA8 may be a second active pattern AP2-8 disposed in the sub-pixel circuit area PXA8 in the (k+1)-th row and the (i+3)-th column among the second active pattern AP2.

The first active pattern AP1 disposed in the sub-pixel circuit areas PXA1, PXA2, PXA3, and PXA4 in the k-th row may be connected in the first direction D1. In an embodiment, the first active patterns AP1-1, AP1-2, AP1-3, and AP1-4 disposed in each of the first to fourth sub-pixel circuit areas PXA1, PXA2, PXA3, and PXA4 may be connected to each other, for example. The second active pattern AP2 disposed in the sub-pixel circuit areas PXA5, PXA6, PXA7, and PXA8 in the (k+1)-th row may be connected in the first direction D1. In an embodiment, the second active patterns AP2-5, AP2-6, AP2-7, and AP2-8 disposed in each of the fifth to eighth sub-pixel circuit areas PXA5, PXA6, PXA7, and PXA8 may be connected to each other, for example. However, the first active pattern AP1 disposed in the sub-pixel circuit areas PXA1, PXA2, PXA3, and PXA4 in the k-th row and the second active patterns AP2 disposed in the sub-pixel circuit areas PXA5, PXA6, PXA7, and PXA8 in the (k+1)-th row may be separated from each other. In an embodiment, the first active pattern AP1-1 and the second active pattern AP2-5 disposed in each of the sub-pixel circuit areas PXA1 and PXA5 in the i-th column may be separated from each other, for example. Similarly, the first active pattern AP1-2 and the second active pattern AP2-6 disposed in the sub-pixel circuit areas PXA2 and PXA6 in the (i+1)-th column may be separated from each other.

Referring back to FIGS. 11 and 12, the gate insulation layer GIL may be disposed on the active layer AP. The gate insulation layer GIL may cover the active layer AP on the buffer layer BFR. The gate insulation layer GIL may have a substantially flat upper surface without creating a step around the active layer AP. Also optionally, the gate insulation layer GIL may have a substantially constant thickness along a profile of the active layer AP. In an embodiment, the gate insulation layer GIL may include a silicon compound, a metal oxide, etc.

Referring back to FIGS. 1, 2, 3, 5, 10, 11, and 12, the gate layer GT1 may be disposed on the gate insulation layer GIL. The gate layer GT1 may include a plurality of gate electrodes GT1c and GT1c', a plurality of first gate lines GT1a and GT1a', a plurality of second gate lines GT1b and GT1b', a plurality of third gate lines GT1d and GT1d', and a plurality of fourth gate lines GT1e and GT1e'. Each of the first gate lines GT1a, the second gate lines GT1b, and the third gate lines GT1d may respectively correspond to the sub-pixel rows PR.

The gate electrodes GT1c and GT1c' may be disposed one by one in each of the sub-pixel circuit areas PXA in the odd rows and the even rows. The first gate lines GT1a and GT1a' may be disposed one by one in each of the sub-pixel circuit areas PXA in the odd rows and the even rows. The second gate lines GT1b and GT1b' may be disposed one by one in each of the sub-pixel circuit areas PXA in the odd rows and the even rows. The third gate lines GT1d and GT1d' may be disposed one by one in each of the sub-pixel circuit areas PXA in the odd rows and the even rows.

In an embodiment, the first gate line GT1a, the second gate line GT1b, the third gate line GT1d, the fourth gate line GT1e, and the gate electrode GT1c may be disposed in the sub-pixel circuit areas PXA1, PXA2, PXA3, and PXA4 in the k-th row, for example. The first gate line GT1a', the second gate line GT1b', the third gate line GT1d', the fourth gate line GT1e', and the gate electrode GT1c' may be disposed in the sub-pixel circuit areas PXA5, PXA6, PXA7, and PXA8 in the (k+1)-th row. In description of the first gate line GT1a', the second gate line GT1b', the third gate line GT1d', the fourth gate line GT1e', and the gate electrode GT1c', components that are the same as those of the first gate line GT1a, the second gate line GT1b, the third gate line GT1d, the fourth gate line GT1e, and the gate electrode GT1c may not be described below. The first gate line GT1a, the second gate line GT1b, the third gate line GT1d, the fourth gate line GT1e, and the gate electrode GT1c may be spaced apart from each other.

The fourth gate line GT1e may be defined to describe a connection relationship between transistors in each sub-pixel row. The fourth gate line GT1e may be the first gate line GT1a. That is, in FIG. 2, the second initialization control signal GB of the seventh transistor T7 may be identical to the first initialization control signal GI of the next sub-pixel row.

In an embodiment, the gate layer GT1 may include a metal, an alloy, a metal nitride, a conductive metal oxide, a transparent conductive material, etc.

The first gate lines GT1a and GT1a' may extend in the first direction D1. The first initialization control signal GI may be provided to the first gate lines GT1a and GT1a'. In an embodiment, the initialization control signal that is provided to the first gate line GT1a' disposed in the sub-pixel circuit areas PXA5, PXA6, PXA7, and PXA8 in the (k+1)-th row may be the first initialization control signal GI that is provided to the sub-pixel circuit areas PXA5, PXA6, PXA7, and PXA8 in the (k+1)-th row and the second initialization control signal GB that is provided to the sub-pixel circuit areas PXA1, PXA2, PXA3, and PXA4 in the k-th row, for example. Each of the first active pattern AP1 and the second active pattern AP2 may overlap the first gate lines GT1a and GT1a'. The first active pattern AP1 may constitute the fourth transistors T4-1 and T4-2 of each of the sub-pixel circuits PXC in the k-th row together with the first gate line GT1a. The second active pattern AP2 may constitute the fourth transistors T4-1 and T4-2 of each of the sub-pixel circuits PXC in the (k+1)-th row together with the first gate line GT1a'. The first gate line GT1a may be a fourth gate line disposed in the immediately preceding sub-pixel row PR.

The second gate lines GT1b and GT1b' may extend in the first direction D1. The gate signal (the gate signal GW of FIG. 2) may be provided to the second gate lines GT1b and GT1b'. Each of the second gate lines GT1b and GT1b' may overlap each of the first active pattern AP1 and the second active pattern AP2. The first active pattern AP1 may constitute the second transistor T2 and the third transistors T3-1 and T3-2 of each of the sub-pixel circuits PXC in the k-th row together with the second gate line GT1b. The second active pattern AP2 may constitute the second transistor T2 and the third transistors T3-1 and T3-2 of each of the sub-pixel circuits PXC in the (k+1)-th row together with the second gate line GT1b'.

The third gate lines GT1d and GT1d' may extend in the first direction D1. The light emission driving signal (the light emission driving signal EM of FIG. 2) may be provided to the third gate lines GT1d and GT1d'. Each of the third gate lines GT1d and GT1d' may overlap each of the first active pattern AP1 and the second active pattern AP2. The first active pattern AP1 may constitute the fifth transistor T5 and the sixth transistor T6 of each of the sub-pixel circuits PXC in the k-th row together with the third gate line GT1d. The second active pattern AP2 may constitute the fifth transistor T5 and the sixth transistor T6 of each of the sub-pixel circuits PXC in the (k+1)-th row together with the third gate line GT1d'.

The fourth gate lines GT1e and GT1e' may extend in the first direction D1. The second initialization control signal GB may be provided to the fourth gate lines GT1e and GT1e'. In an embodiment, the initialization control signal that is provided to the fourth gate lines GT1e and GT1e' disposed in the sub-pixel circuit areas PXA1, PXA2, PXA3, and PXA4 in the k-th row may be the second initialization control signal GB that is provided to the sub-pixel circuit areas PXA1, PXA2, PXA3, and PXA4 in the k-th row and the first initialization control signal GI that is provided to the sub-pixel circuit areas PXA5, PXA6, PXA7, and PXA8 in the (k+1)-th row, for example. That is, the fourth gate line GT1e may be the first gate line GT1a' of the next sub-pixel row.

In the k-th row and the (k+1)-th row, the first gate lines GT1a and GT1a', the second gate lines GT1b and GT1b', the gate electrodes GT1c and GT1c', the third gate line GT1d and GTd' and the fourth gate lines GT1e and GT1e' may be repeatedly disposed. Also, the fourth gate line GT1e in the k-th row and the first gate line GT1a in the (k+1)-th row may be used in common.

The fourth gate line GT1e disposed in the sub-pixel circuit areas PXA1, PXA2, PXA3, and PXA4 in the k-th row may overlap the first active pattern AP1 disposed in the sub-pixel circuit area in the k-th row. The first active pattern AP1 may constitute the seventh transistor T7 of each of the sub-pixel circuits PXC in the k-th row together with the fourth gate line GT1e. The fourth gate line GT1e' disposed in the sub-pixel circuit areas PXA5, PXA6, PXA7, and PXA8 in the (k+1)-th row may overlap the second active pattern AP2. The second active pattern AP2 may constitute the seventh transistor T7 of each of the sub-pixel circuits PXC in the (k+1)-th row together with the fourth gate line GT1e'.

Since the fourth gate line GT1e disposed in the sub-pixel circuit areas PXA1, PXA2, PXA3, and PXA4 in the k-th row is the first gate line GT1a' disposed in the sub-pixel circuit areas PXA5, PXA6, PXA7, and PXA8 in the (k+1)-th row, the second active pattern AP2 may constitute the fourth transistors T4-1 and T4-2 of each of the sub-pixel circuits PXC in the (k+1)-th row together with the fourth gate line GT1e disposed in the sub-pixel circuit areas PXA1, PXA2, PXA3, and PXA4 in the k-th row. That is the second active pattern AP2 may constitute the fourth transistors T4-1 and T4-2 of each of the sub-pixel circuits PXC in the (k+1)-th row together with the first gate line GT1a' disposed in the sub-pixel circuit areas PXA5, PXA6, PXA7, and PXA8 in the (k+1)-th row.

The gate electrode GT1c may be disposed between the second gate line GT1b and the third gate line GT1d. The gate electrode GT1c may overlap each of the first active pattern AP1 and the second active pattern AP2. A portion in which the first active pattern AP1 and the gate electrode GT1c overlap may be defined as the first transistor T1. That is, the first active pattern AP1 may constitute the first transistor T1 of each of the sub-pixel circuits PXC in the k-th row together with the gate electrode GT1c. A portion in which the second active pattern AP2 and the gate electrode GT1c' overlap may be defined as the first transistor T1. The second active pattern AP2 may constitute the first transistor T1 of each of the sub-pixel circuits PXC in the (k+1)-th row together with the gate electrode GT1c'.

Referring to FIGS. 11 and 12 again, the insulation layer IL may be disposed on the gate layer GT1. The insulation layer IL may cover the gate layer GT1 on the gate insulation layer GIL. The insulation layer IL may have a substantially flat upper surface without creating a step around the gate layer GT1. Optionally, the insulation layer IL may have a substantially constant thickness along the profile of the gate layer GT1. In an embodiment, the insulation layer IL may include a silicon compound, a metal oxide, etc.

Referring back to FIGS. 1, 2, 3, 7, 10, 11, and 12, the first conductive layer GT2 may be disposed on the insulation layer IL. The first conductive layer GT2 may include a plurality of first power lines GT2a, a plurality of second power lines GT2b, and a plurality of storage electrodes GT2c. Each of the first power lines GT2a, the second power lines GT2b, and the storage electrodes GT2c may respectively correspond to the sub-pixel circuit areas PXA.

In an embodiment, the first power line GT2a may correspond to the first to fourth sub-pixel circuit areas PXA1, PXA2, PXA3, and PXA4 in the k-th row. The first power line GT2a may overlap the sub-pixel circuit areas PXA1, PXA2, PXA3, and PXA4 in the k-th row, for example. The second power line GT2b may correspond to the sub-pixel circuits PXC in the (k+1)-th row. The second power line GT2b may overlap the sub-pixel circuit areas PXA5, PXA6, PXA7, and PXA8 in the (k+1)-th row. Specifically, the second power line GT2b may partially overlap with a portion that protrudes in the third direction D3 among the sub-pixel circuit areas PXA5, PXA6, PXA7, and PXA8 in the (k+1)-th row. In an embodiment, the first conductive layer GT2 may include a metal, an alloy, a metal nitride, a conductive metal oxide, a transparent conductive material, etc.

Referring further to FIG. 8, the first power lines GT2a may be disposed in one side of the second gate lines GT1b disposed in the sub-pixel circuit areas PXA1, PXA2, PXA3, and PXA4 in the odd rows among the second gate lines GT1b and GT1b'. Each of the first power lines GT2a may be spaced apart from each of the second gate lines GT1b disposed in the sub-pixel circuit areas PXA1, PXA2, PXA3, and PXA4 in the odd rows in the third direction D3. The second power lines GT2b may be disposed in one side of the second gate lines GT1b' disposed in the sub-pixel circuit areas PXA5, PXA6, PXA7, and PXA8 in the even rows among the second gate lines GT1b and GT1b'. Each of the second power lines GT2b may be spaced apart from each of the second gate lines GT1b' disposed in the sub-pixel circuit areas PXA5, PXA6, PXA7, and PXA8 in the even rows in the third direction D3.

The storage electrode GT2c may extend in the first direction D1. The storage electrode GT2c may overlap the gate electrode GT1c and may constitute the storage capacitor CST together with the gate electrode GT1c.

The inter-insulation layer ILD may be disposed on the first conductive layer GT2. In an embodiment, the inter-insulation layer ILD may sufficiently cover the first conductive layer GT2 on the insulation layer IL, and may have a substantially flat upper surface without creating a step around the first conductive layer GT2. In another embodiment, the inter-insulation layer ILD may cover the first conductive layer GT2 on the insulation layer IL and may have a substantially constant thickness along a profile of the first conductive layer GT2. The inter-insulation layer ILD may include an organic insulating material or an inorganic insulating material.

Referring to FIGS. 1, 2, 3, 9, 10, 11, and 12, the second conductive layer SD may be disposed on the inter-insulation layer ILD. The second conductive layer SD may include a plurality of first transmission lines SDa, a plurality of second transmission lines SDb, a plurality of data lines SDd, a plurality of high power voltage lines SDc, a plurality of first connection patterns SDe, a plurality of second connection patterns SDf, a plurality of third connection patterns SDg, and a plurality of fourth connection patterns SDh. Each of the first transmission lines SDa, the second transmission lines SDb, the data lines SDd, the high power voltage lines SDc, the first connection patterns SDe, and the second connection patterns SDf, the third connection patterns SDg, and the fourth connection patterns SDh may be respectively disposed to correspond to the sub-pixel columns PC. The data line SDd may be disposed one by one in each of the sub-pixel circuit areas PXA in the odd columns and the even columns. The first transmission lines SDa, the second transmission lines SDb, the data lines SDd, the high power voltage lines SDc, the first connection patterns SDe, and the second connection patterns SDf, the third connection patterns SDg, and the fourth connection patterns SDh may be spaced apart from each other.

Each of the first transmission lines SDa may correspond to each of the sub-pixel circuit areas PXA1 and PXA5 in the i-th column. Each of the first transmission lines SDa may overlap each of the sub-pixel circuit areas PXA1 and PXA5 in the i-th column. Each of the second transmission lines SDb may overlap each of the sub-pixel circuit areas PXA2 and PXA6 in the (i+1)-th column. The first connection pattern SDe and the second connection pattern SDf may be disposed in each of the sub-pixel circuit areas PXA1, PXA2, PXA3, and PXA4 in the k-th row. The third connection pattern SDg and the fourth connection pattern SDh may be disposed in each of the sub-pixel circuit areas PXA5, PXA6, PXA7, and PXA8 in the (k+1)-th row. In an embodiment, the second conductive layer SD may include a metal, an alloy, a metal nitride, a conductive metal oxide, a transparent conductive material, etc.

The first transmission lines SDa may be disposed in one side of the data lines SDd disposed in the sub-pixel circuit areas PXA1, PXA3, PXA5, and PXA7 in the odd columns among the data lines SDd. Each of the first transmission lines SDa may be spaced apart from each of the data lines SDd disposed in the sub-pixel circuit areas PXA1, PXA3, PXA5, and PXA7 in the odd columns in the second direction D2. The second transmission lines SDb may be disposed in one side of the data lines SDd disposed in the sub-pixel circuit areas PXA2, PXA4, PXA6, and PXA8 in the even columns among the data lines SDd. Each of the second transmission lines SDb may be spaced apart from each of the data lines SDd disposed in the sub-pixel circuit areas PXA2, PXA4, PXA6, and PXA8 in the even columns in the second direction D2.

The data line SDd may extend in the second direction D2. The data signal (the data signal DATA of FIG. 2) may be provided to the data line SDd. The data line SDd may be electrically connected to the active layer AP. The data line SDd may directly contact the active layer AP through contact holes defined in the inter-insulation layer ILD, the insulation layer IL, and the gate insulation layer GIL.

The high power voltage line SDc may extend in the second direction D2. The high power voltage (the high power voltage ELVDD of FIG. 2) may be provided to the high power voltage line SDc. The high power voltage line SDc may be electrically connected to the active layer AP and the storage electrode GT2c. The high power voltage line SDc may directly contact the active layer AP through contact holes defined in the inter-insulation layer ILD, the insulation layer IL, and the gate insulation layer GIL, and may directly contact the storage electrode GT2c through contact hole defined in the inter-insulation layer ILD.

The first transmission line SDa may extend in the second direction D2. The first initialization voltage VINT1 may be provided to the first transmission line SDa. The first transmission line SDa may be electrically connected to the first active pattern AP1, the second active pattern AP2, and the first power line GT2a. The first transmission line SDa may directly contact the first active pattern AP1-1 and the second active pattern AP2-5 disposed in the sub-pixel circuit areas PXA1 and PXA5 in the i-th column, respectively. The first transmission line SDa may directly contact the first power line GT2a through a contact hole (e.g., the first contact hole CNT1 of FIG. 3) defined in the inter-insulation layer ILD. Specifically, the first transmission line SDa may directly contact the first active pattern AP1-1 and AP1-3 disposed in the first and third sub-pixel circuit areas PXA1 and PXA3, respectively. Also, the first transmission line SDa may directly contact the first power line GT2a disposed in the first and third sub-pixel circuit areas PXA1 and PXA3. The first power line GT2a and the first transmission line SDa may constitute a driving initialization voltage line that transmits the first initialization voltage VINT1.

The second transmission line SDb may extend in the second direction D2. The second initialization voltage VINT2 may be provided to the second transmission line SDb.

The second transmission line SDb may be electrically connected to the first active pattern AP1, the second active pattern AP2, and the second power line GT2b. The second transmission line SDb may directly contact the first and second active patterns AP1-2 and AP2-6 respectively disposed in the sub-pixel circuit areas PXA2 and PXA6 in the (i+1)-th column through contact holes (e.g., the fourth contact hole CNT4 and the sixth contact hole CNT6 in FIG. 10) defined in the inter-insulation layer ILD, the insulation layer IL, and the gate insulation layer GIL, respectively. The second transmission line SDb may directly contact the second power line GT2b through a contact hole (e.g., the second contact hole CNT2 of FIG. 3) defined in the inter-insulation layer ILD. Specifically, the second transmission line SDb may directly contact the first active pattern AP1-2 and AP1-4 respectively disposed in the second and fourth sub-pixel circuit areas PXA2 and PXA4. The second transmission line SDb may directly contact the second active pattern AP2-6 and AP2-8 respectively disposed in the sixth and eighth sub-pixel circuit areas PXA6 and PXA8. Also, the second transmission line SDb may directly contact the second power line GT2b disposed in the second and fourth sub-pixel circuit areas PXA2 and PXA4. The second power line GT2b and the second transmission line SDb may constitute a diode initialization voltage line that transmits the second initialization voltage VINT2.

The first connection pattern SDe may directly contact the active layer AP through a contact hole (e.g., the seventh contact hole CNT7 of FIG. 10) defined in the inter-insulation layer ILD, the insulation layer IL, and the gate insulation layer GIL, and may directly contact the gate electrode GT1c through a contact hole defined in the inter-insulation layer ILD, and the insulation layer IL.

In an embodiment, the first transmission line SDa may directly contact the first active pattern AP1-1 disposed in the sub-pixel circuit area in the i-th column among the first active patterns AP1, and the first connection pattern SDe may directly contact the first active pattern AP1-1 disposed in the sub-pixel circuit areas PXA1 and PXA5 in the i-th column. In addition, as the first active pattern AP1-1 disposed in the sub-pixel circuit area PXA1 in the i-th column and the first active pattern AP1-2 disposed in the sub-pixel circuit area PXA2 in the (i+1)-th column are connected, the driving initialization voltage line may be electrically connected to a portion of the first active pattern AP1 that corresponds to the fourth transistors T4-1 and T4-2 of each pixel.

The second connection pattern SDf may directly contact the active layer AP through a contact hole (e.g., the eighth contact hole CNT8 of FIG. 10) defined in the inter-insulation layer ILD, the insulation layer IL, and the gate insulation layer GIL.

In an embodiment, the second transmission line SDb may directly contact the first active pattern AP1-2 disposed in the sub-pixel circuit area PXA2 in the (i+1)-th column among the first active pattern AP1 and the second connection pattern SDf may directly contact the first active pattern AP1-2 disposed in the sub-pixel circuit area PXA2 in the (i+1)-th column. In addition, as the first active pattern AP1-2 disposed in the sub-pixel circuit area PXA2 in the (i+1)-th column and the first active pattern AP1-2 disposed in the sub-pixel circuit area PXA3 in the (i+2)-th column are connected, the diode initialization voltage line may be electrically connected to a portion of the first active pattern AP1 that corresponds to the seventh transistor T7 of each pixel.

Accordingly, the first initialization voltage VINT1 may be commonly provided to the first active pattern AP1-1 disposed in the sub-pixel circuit area PXA1 in the i-th column and the first active pattern AP1-2 disposed in the sub-pixel circuit area PXA2 in the (i+1)-th column. In addition, the second initialization voltage VINT2 may be commonly provided to the first active pattern AP1-2 disposed in the sub-pixel circuit area PXA2 in the (i+1)-th column and the first active pattern AP1-2 disposed in the sub-pixel circuit area PXA3 in the (i+2)-th column.

The third connection pattern SDg may contact the active layer AP through a contact hole (e.g., the ninth contact hole CNT9 of FIG. 10) defined in the inter-insulation layer ILD, the insulation layer IL, and the gate insulation layer GIL and may directly contact the gate electrode GT1c through a contact hole defined in the inter-insulation layer ILD and the insulation layer IL.

In an embodiment, the first transmission line SDa may directly contact the second active pattern AP2-5 disposed in the sub-pixel circuit area PXA5 in the i-th column, and the third connection pattern SDg may directly contact the second active pattern AP2-5 disposed in the sub-pixel circuit area PXA5 in the i-th column. In addition, as the second active pattern AP2-5 disposed in the sub-pixel circuit area PXA5 in the i-th column and the second active pattern AP2-6 disposed in the sub-pixel circuit area PXA6 in the (i+1)-th column are connected, the driving initialization voltage line may be electrically connected to a portion of the second active pattern AP2 that corresponds to the seventh transistor T7 of each pixel.

The fourth connection pattern SDh may directly contact the active layer AP through a contact hole (e.g., the tenth contact hole CNT10 of FIG. 10) defined in the inter-insulation layer ILD, the insulation layer IL, and the gate insulation layer GIL.

In an embodiment, the second transmission line SDb may directly contact the second active pattern AP2-6 disposed in the sub-pixel circuit area PXA6 in the (i+1)-th column, and the fourth connection pattern SDh may directly contact the second active pattern AP2-6 disposed in the sub-pixel circuit area PXA6 in the (i+1)-th column. In addition, as the second active pattern AP2-6 disposed in the sub-pixel circuit area PXA6 in the (i+1)-th column and the second active pattern AP2-6 disposed in the sub-pixel circuit area PXA7 in the (i+2)-th column are connected, the diode initialization voltage line may be electrically connected to a portion of the second active pattern AP2 that corresponds to the seventh transistor T7 of each pixel.

Accordingly, the first initialization voltage VINT1 may be commonly provided to the second active pattern AP2-5 disposed in the sub-pixel circuit area PXA5 in the i-th column and the second active pattern AP2-6 disposed in the sub-pixel circuit area PXA6 in the (i+1)-th column. In addition, the second initialization voltage VINT2 may be commonly provided to the second active pattern AP2-6 disposed in the sub-pixel circuit area PXA6 in the (i+1)-th column and the second active pattern AP2-6 disposed in the sub-pixel circuit area PXA7 in the (i+2)-th column.

Referring back to FIGS. 11 and 12, the via-insulation layer VIA may be disposed on the second conductive layer SD. The via-insulation layer VIA may sufficiently cover the second conductive layer SD on the inter-insulation layer ILD. The via-insulation layer VIA may have a substantially flat upper surface without creating a step around the second conductive layer SD. In an embodiment, the via-insulation layer VIA may include an organic insulating material such as a photoresist, an acrylic resin, a polyimide-based resin, a polyamide-based resin, or a siloxane-based resin.

The first electrode 700 may be disposed on the via-insulation layer VIA. The first electrode 700 may directly contact the second connection pattern SDf through a contact hole defined in the via-insulation layer VIA. According to a light emission method of the display device 10, the first electrode 700 may include a reflective material or a transmissive material. In an embodiment, the first electrode 700 may include a metal layer, an alloy layer, a metal nitride layer, a conductive metal oxide layer, and/or a transparent conductive oxide layer. In an embodiment, the first electrode 700 may include at least one of aluminum (Al), an alloy including aluminum (Al), aluminum nitride (AlNx), silver (Ag), an alloy including at least one of silver (Ag), tungsten (W), tungsten nitride (WNx), copper (Cu), an alloy including at least one of copper (Cu), nickel (Ni), chromium (Cr), chromium nitride (CrNx), molybdenum (Mo), molybdenum (Mo), an alloy including at least one of titanium (Ti), titanium nitride (TiNx), platinum (Pt), tantalum (Ta), tantalum nitride (TaNx), neodymium (Nd), scandium (Sc), zinc oxide (ZnOx), indium tin oxide ("ITO"), tin oxide (SnOx), indium oxide (InOx), gallium oxide (GaOx), indium zinc oxide ("IZO"), etc., for example.

In an embodiment, the first electrode 700 may be formed or provided in a multilayer structure. Optionally, the first electrode 700 may have a single layer structure. The pixel defining layer PDL may be disposed on the first electrode 700. The pixel defining layer PDL may include an organic insulating material, an inorganic insulating material, etc. In an embodiment, the pixel defining layer PDL may include at least one of a photoresist, a polyacrylic resin, a polyimide-based resin, an acrylic resin, a silicon compound, etc., for example. In an embodiment, an opening that partially exposes the first electrode 700 may be defined in the pixel defining layer PDL. An emission area and a non-emission area of the display device 10 may be defined by the opening of the pixel defining layer PDL. In an embodiment, a portion of the pixel defining layer PDL in which the opening is defined may correspond to the emission area, and the non-emission area may correspond to a portion adjacent to the opening of the pixel defining layer PDL, for example.

The light emitting layer 800 may be disposed on the first electrode 700 that is exposed through the opening of the pixel defining layer PDL. Also, the light emitting layer 800 may extend on a sidewall of the opening of the pixel defining layer PDL. In an embodiment, the light emitting layer 800 may have a multilayer structure that includes an organic light emitting layer, a hole injection layer, a hole transport layer, an electron transport layer, an electron injection layer, etc.

The second electrode 900 may be disposed on the pixel defining layer PDL and the light emitting layer 800. According to the light emission method of the display device 10, the second electrode 900 may include a transmissive material or a reflective material. The second electrode 900 may include a metal layer, an alloy layer, a metal nitride layer, a conductive metal oxide layer, and/or a transparent conductive oxide layer. The second electrode 900 may be formed or provided in a single layer structure.

The first electrode 700, the light emitting layer 800, and the second electrode 900 may constitute a light emitting diode LD. In an embodiment, the first electrode 700 may be an anode electrode of the light emitting diode LD, and the second electrode 900 may be a cathode electrode of the light emitting diode LD.

An encapsulation layer may be disposed on the second electrode 900. The encapsulation layer may prevent penetration of external moisture and oxygen. The encapsulation layer may include at least one inorganic encapsulation layer and at least one organic encapsulation layer. At least one inorganic encapsulation layer and at least one organic encapsulation layer may be alternately stacked. However, the invention is not limited thereto, and the encapsulation layer may be a glass substrate and may include a same material as that of the substrate SUB.

Referring back to FIGS. 2, 3, 10, 11, and 12, in an embodiment, the first power line GT2a and the first transmission line SDa may cross each other. Specifically, the first transmission line SDa may be connected to the first power line GT2a through the first contact hole CNT1 defined in a portion in which the first power line GT2a and the first transmission line SDa cross each other. The first contact hole CNT1 may be defined in the first sub-pixel circuit area PXA1 in the k-th row and the i-th column. That is, the first contact hole CNT1 may be defined one by one in each of the first sub-pixel circuit area PXA1 and the third sub-pixel circuit area PXA3.

The second power line GT2b and the second transmission line SDb may cross each other. Specifically, the second transmission line SDb may be connected to the second power line GT2b through the second contact hole CNT2 defined in a portion in which the second power line GT2b and the second transmission line SDb cross each other. The second contact hole CNT2 may be defined in the second sub-pixel circuit area PXA2 in the k-th row and the (i+1)-th column. The second contact hole CNT2 may be defined one by one in each of the second sub-pixel circuit area PXA2 and the fourth sub-pixel circuit area PXA4.

The first power line GT2a and the second transmission line SDb may not contact each other. The first power line GT2a and the second transmission line SDb may not be connected to each other. That is, a contact hole may not be defined in a portion in which the first power line GT2a and the second transmission line SDb overlap each other. A contact hole may not be defined in the sixth sub-pixel circuit area PXA6 and the eighth sub-pixel circuit area PXA8.

The second power line GT2b and the first transmission line SDa may not contact each other. The second power line GT2b and the first transmission line SDa may not be connected to each other. That is, a contact hole may not be defined in a portion in which the second power line GT2b and the first transmission line SDa overlap each other. A contact hole may not be defined in the fifth sub-pixel circuit area PXA5 and the seventh sub-pixel circuit area PXA7.

The first active pattern AP1 may be connected to the first transmission line SDa through the third contact hole CNT3. The third contact hole CNT3 may be defined in the first sub-pixel circuit area PXA1 in the k-th row and the i-th column. Accordingly, the third contact hole CNT3 may be defined in each of the first and third sub-pixel circuit areas PXA1 and PXA3. The first active pattern AP1 may be connected to the second transmission line SDb through the fourth contact hole CNT4. The fourth contact hole CNT4 may be defined in the second sub-pixel circuit area PXA2 in the k-th row and the (i+1)-th column. Accordingly, the fourth contact hole CNT4 may be defined in each of the second and fourth sub-pixel circuit areas PXA2 and PXA4.

The first active pattern AP1 may be connected to the first connection pattern SDe through the seventh contact hole CNT7. The seventh contact hole CNT7 may be defined in each of the sub-pixel circuit areas PXA1, PXA2, PXA3, and PXA4 in the k-th row. Accordingly, the seventh contact hole CNT7 may be defined in each of the first to fourth sub-pixel circuit areas PXA1, PXA2, PXA3, and PXA4. The first connection pattern SDe may be connected to the first transistor T1.

Based on the first sub-pixel circuit area PXA1, the first initialization voltage VINT1 may be provided from the first power line GT2a to the first transmission line SDa through the first contact hole CNT1. The first initialization voltage VINT1 may be provided from the first transmission line SDa to the first active pattern AP1-1 disposed in the first sub-pixel circuit area PXA1 through the third contact hole CNT3. The first initialization voltage VINT1 may be provided from the first active pattern AP1-1 to the first connection pattern SDe disposed in the first sub-pixel circuit area PXA1 through the seventh contact hole CNT7 defined in the first sub-pixel circuit area PXA1. Finally, the first initialization voltage VINT1 may be provided from the first connection pattern SDe disposed in the first sub-pixel circuit area PXA1 to the first transistor T1 of the first sub-pixel circuit.

Based on the second sub-pixel circuit area PXA2, the first initialization voltage VINT1 may be provided from the first power line GT2a to the first transmission line SDa through the first contact hole CNT1. The first initialization voltage VINT1 may be provided from the first transmission line SDa to the first active pattern AP1-2 disposed in the second sub-pixel circuit area PXA2 through the third contact hole CNT3. The first initialization voltage VINT1 may be provided from the first active pattern AP1-2 to the first connection pattern SDe disposed in the second sub-pixel circuit area PXA2 through the seventh contact hole CNT7 defined in the second sub-pixel circuit area PXA2. Finally, the first initialization voltage VINT1 may be provided from the first connection pattern SDe disposed in the second sub-pixel circuit area PXA2 to the first transistor T1 of the second sub-pixel circuit.

The first active pattern AP1-1 disposed in the first sub-pixel circuit area PXA1 and the first active pattern AP1-2 disposed in the second sub-pixel circuit area PXA2 may be connected to each other. In addition, each of the first active pattern AP1-1 disposed in the first sub-pixel circuit area PXA1 and the first active pattern AP1-2 disposed in the second sub-pixel circuit area PXA2 may receive the first initialization voltage VINT1 through the third contact hole CNT3.

The third sub-pixel circuit area PXA3 may be identical to the first sub-pixel circuit area PXA1, and the fourth sub-pixel circuit area PXA4 may be identical to the second sub-pixel circuit area PXA2. Consequently, the first sub-pixel circuit area PXA1 may correspond to the sub-pixel circuit area PXA1 in the k-th row and the i-th column. Also, the second sub-pixel circuit area PXA2 may correspond to the sub-pixel circuit area PXA2 in the k-th row and the (i+1)-th column.

The first active pattern AP1-1 and AP1-2 may be connected to the second connection pattern SDf through the eighth contact hole CNT8. The eighth contact hole CNT8 may be defined in each of the sub-pixel circuit areas PXA1, PXA2, PXA3, and PXA4 in the k-th row. Accordingly, the eighth contact hole CNT8 may be defined in each of the first to fourth sub-pixel circuit areas PXA1, PXA2, PXA3, and PXA4. The second connection pattern SDf may be connected to the light emitting diode LD. That is, the second connection pattern SDf may be a connection electrode that connects the sixth transistor T6 and the light emitting diode LD.

Based on the second sub-pixel circuit area PXA2, the second initialization voltage VINT2 may be provided from the second power line GT2$b$ to the second transmission line SDb through the second contact hole CNT2. The second initialization voltage VINT2 may be provided from the second transmission line SDb to the first active pattern AP1-2 disposed in the second sub-pixel circuit area PXA2 through the fourth contact hole CNT4. The second initialization voltage VINT2 may be provided from the first active pattern AP1-2 to the second connection pattern SDf disposed in the second sub-pixel circuit area PXA2 through the eighth contact hole CNT8. Finally, the second initialization voltage VINT2 may be provided from the second connection pattern SDf disposed in the second sub-pixel circuit area PXA2 to the light emitting diode LD disposed in the second sub-pixel circuit area PXA2.

Based on the third sub-pixel circuit area PXA3, the second initialization voltage VINT2 may be provided from the second power line GT2$b$ to the second transmission line SDb through the second contact hole CNT2. The second initialization voltage VINT2 may be provided from the second transmission line SDb to the first active pattern AP1-3 disposed in the third sub-pixel circuit area PXA3 through the fourth contact hole CNT4. The second initialization voltage VINT2 may be provided from the first active pattern AP1-3 to the second connection pattern SDf disposed in the third sub-pixel circuit area PXA3 through the eighth contact hole CNT8. Finally, the second initialization voltage VINT2 may be provided from the second connection pattern SDf disposed in the third sub-pixel circuit area PXA3 to the light emitting diode LD disposed in the third sub-pixel circuit area PXA3.

The first active pattern AP1-2 disposed in the second sub-pixel circuit area PXA2 and the first active pattern AP1-3 disposed in the third sub-pixel circuit area PXA3 may be connected to each other. In addition, each of the first active pattern AP1-2 disposed in the second sub-pixel circuit area PXA2 and the first active pattern AP1-3 disposed in the third sub-pixel circuit area PXA3 may be provided the second initialization voltage VINT2 through the fourth contact hole CNT4.

The fourth sub-pixel circuit area PXA4 may be identical to the second sub-pixel circuit area PXA2, and the first sub-pixel circuit area PXA1 may be identical to the third sub-pixel circuit area PXA3. Consequently, the second sub-pixel circuit area PXA2 may correspond to the second sub-pixel circuit area PXA2 in the k-th row and the (i+1)-th column. Also, the third sub-pixel circuit area PXA3 may correspond to the sub-pixel circuit area PXA3 in the k-th row and the (i+2)-th column.

The second active pattern AP2 may be connected to the first transmission line SDa through the fifth contact hole CNT5. The fifth contact hole CNT5 may be defined in the sub-pixel circuit area PXA5 in the (k+1)-th row and the i-th column. Accordingly, the fifth contact hole CNT5 may be defined in each of the fifth and seventh sub-pixel circuit areas PXA5 and PXA7. The second active pattern AP2 may be connected to the second transmission line SDb through the sixth contact hole CNT6. The sixth contact hole CNT6 may be defined in the sub-pixel circuit area PXA6 in the (k+1)-th row and the (i+1)-th column. Accordingly, the sixth contact hole CNT6 may be defined in each of the sixth and eighth sub-pixel circuit areas PXA6 and PXA8.

The second active pattern AP2-5 and AP2-6 may be connected to the third connection pattern SDg through the ninth contact hole CNT9. The ninth contact hole CNT9 may be defined in each of the sub-pixel circuit areas PXA5, PXA6, PXA7, and PXA8 in the (k+1)-th row. Accordingly, the ninth contact hole CNT9 may be defined in each of the fifth to eighth sub-pixel circuit areas PXA5, PXA6, PXA7, and PXA8. The third connection pattern SDg may be connected to the first transistor T1 of each of the fifth to eighth sub-pixel circuits PXC.

Based on the fifth sub-pixel circuit area PXA5, the first initialization voltage VINT1 may be provided from the first power line GT2$a$ to the first transmission line SDa through the first contact hole CNT1. The first initialization voltage VINT1 may be provided from the first transmission line SDa to the second active pattern AP2-5 disposed in the fifth sub-pixel circuit area PXA5 through the fifth contact hole CNT5. The first initialization voltage VINT1 may be provided from the second active pattern AP2-5 to the third connection pattern SDg disposed in the fifth sub-pixel circuit area PXA5 through the ninth contact hole CNT9 disposed in the fifth sub-pixel circuit area PXA5. Finally, the first initialization voltage VINT1 may be provided from the third connection pattern SDg to the first transistor T1 of the fifth sub-pixel circuit.

Based on the sixth sub-pixel circuit area PXA6, the first initialization voltage VINT1 may be provided from the first power line GT2$a$ to the first transmission line SDa through the first contact hole CNT1. The first initialization voltage VINT1 may be provided from the first transmission line SDa to the second active pattern AP2-6 disposed in the sixth sub-pixel circuit area PXA6 through the fifth contact hole CNT5. The first initialization voltage VINT1 may be provided from the second active pattern AP2-6 to the third connection pattern SDg disposed in sixth sub-pixel circuit area PXA6 through the ninth contact hole CNT9 defined in the sixth sub-pixel circuit area PXA6. Finally, the first initialization voltage VINT1 may be provided from the third connection pattern SDg disposed in the sixth sub-pixel circuit area PXA6 to the first transistor T1 of the sixth sub-pixel circuit.

The second active pattern AP2-5 disposed in the fifth sub-pixel circuit area PXA5 and the second active pattern AP2-6 disposed in the sixth sub-pixel circuit area PXA6 may be connected to each other. In addition, each of the second active pattern AP2-5 disposed in the fifth sub-pixel circuit area PXA5 and the second active pattern AP2-6 disposed in the sixth sub-pixel circuit area PXA6 may receive the first initialization voltage VINT1 through the fifth contact hole.

The seventh sub-pixel circuit area PXA7 may be identical to the fifth sub-pixel circuit area PXA5, and the eighth sub-pixel circuit area PXA8 may be identical to the sixth sub-pixel circuit area PXA6. Consequently, the fifth sub-pixel circuit area PXA5 may correspond to the fifth sub-pixel circuit area PXA5 in the (k+1)-th row and the i-th column. Also, the sixth sub-pixel circuit area PXA6 may correspond to the sixth sub-pixel circuit area PXA6 in the (k+1)-th row and the (i+1)-th column.

The second active pattern AP2-5 and AP2-6 may be connected to the fourth connection pattern SDh through the tenth contact hole CNT10. The tenth contact hole CNT10 may be defined in each of the sub-pixel circuit areas PXA5, PXA6, PXA7, and PXA8 in the (k+1)-th row. Accordingly, the tenth contact hole CNT10 may be defined in each of the fifth to eighth sub-pixel circuit areas PXA5, PXA6, PXA7, and PXA8. The fourth connection pattern SDh may be connected to the light emitting diode LD. That is, the fourth connection pattern SDh may be a connection electrode that connects the sixth transistor T6 and the light emitting diode LD.

Based on the sixth sub-pixel circuit area PXA6, the second initialization voltage VINT2 may be provided from the second power line GT2b to the second transmission line SDb through the second contact hole CNT2. The second initialization voltage VINT2 may be provided from the second transmission line SDb to the second active pattern AP2-6 disposed in the sixth sub-pixel circuit area PXA6 through the sixth contact hole CNT6. The second initialization voltage VINT2 may be provided from the second active pattern AP2-6 to the fourth connection pattern SDh disposed in the sixth sub-pixel circuit area PXA6 through the tenth contact hole CNT10. Finally, the second initialization voltage VINT2 may be provided from the fourth connection pattern SDh disposed in the sixth sub-pixel circuit area PXA6 to the light emitting diode LD disposed in the sixth sub-pixel circuit area PXA6.

Based on the seventh sub-pixel circuit area PXA7, the second initialization voltage VINT2 may be provided from the second power line GT2b to the second transmission line SDb through the second contact hole CNT2. The second initialization voltage VINT2 may be provided from the second transmission line SDb to the second active pattern AP2-7 disposed in the seventh sub-pixel circuit area PXA7 through the sixth contact hole CNT6. The second initialization voltage VINT2 may be provided from the second active pattern AP2-7 to the fourth connection pattern SDh disposed in the seventh sub-pixel circuit area PXA7 through the tenth contact hole CNT10. Finally, the second initialization voltage VINT2 may be provided from the fourth connection pattern SDh disposed in the seventh sub-pixel circuit area PXA7 to the light emitting diode LD disposed in the seventh sub-pixel circuit area PXA7. Although only the fifth sub-pixel circuit area PXA5 is illustrated in FIG. 10, the fifth sub-pixel circuit area PXA5 and the seventh sub-pixel circuit area PXA7 may be identical to each other.

The second active pattern AP2-6 disposed in the sixth sub-pixel circuit area PXA6 and the second active pattern AP2-7 disposed in the seventh sub-pixel circuit area PXA7 may be connected to each other. In addition, each of the second active pattern AP2-6 disposed in the sixth sub-pixel circuit area PXA6 and the second active pattern AP2-7 disposed in the seventh sub-pixel circuit area PXA7 may receive the second initialization voltage VINT2 through the sixth contact hole CNT6.

The eighth sub-pixel circuit area PXA8 may be identical to the sixth sub-pixel circuit area PXA6, and the fifth sub-pixel circuit area PXA5 may be identical to the seventh sub-pixel circuit area PXA7. Consequently, the sixth sub-pixel circuit area PXA6 may correspond to the sub-pixel circuit area PXA6 in the (k+1)-th row and the (i+1)-th column. Also, the seventh sub-pixel circuit area PXA7 may correspond to the sub-pixel circuit area PXA7 in the (k+1)-th row and the (i+2)-th column.

The first power line GT2a may overlap the sub-pixel circuit areas PXA1, PXA2, PXA3, and PXA4 in the k-th row, and the second power line GT2b may overlap the sub-pixel circuit areas PXA5, PXA6, PXA7, and PXA8 in the (k+1)-th row. That is, each of the first power lines GT2a and the second power lines GT2b may extend in the first direction D1 and may be alternately arranged with each other in each row in the second direction D2. Accordingly, only one initialization power line may be disposed in the sub-pixel circuit areas disposed in one row. Accordingly, a size of the sub-pixel may be relatively reduced. Since the size of each sub-pixel is reduced, the number of sub-pixels that may be disposed in the display device 10 may increase. Accordingly, the display device 10 may have a high resolution.

Since only one power line is disposed in the sub-pixel circuit areas disposed in one row, a density of the wiring may be relatively reduced. In the method of manufacturing the display device 10, it is possible to prevent a defect from generating in the process of forming the wirings.

Also, since only one power line is disposed in the sub-pixel circuit areas disposed in one row, resistance due to capacitance may be reduced. Accordingly, the scan on time ("SOT") of each of the sub-pixel may be sufficiently long. That is, time that is desired for providing the data signals to each of the sub-pixel may be sufficiently secured.

The method and the system in the embodiments may be applied to a display device included in a computer, a notebook, a mobile phone, a smartphone, a smart pad, a portable media player ("PMP"), a personal digital assistant ("PDA"), an MP3 player, or the like.

Although the methods and the systems in the embodiments have been described with reference to the drawings, the illustrated embodiments are examples, and may be modified and changed by a person having ordinary knowledge in the relevant technical field without departing from the technical spirit described in the following claims.

What is claimed is:

1. A display device comprising:
    a substrate which includes a plurality of sub-pixel circuit areas which are arranged in m rows and n columns, where m and n are positive integers;
    a plurality of first gate lines which extend in a row direction;
    a plurality of data lines which extend in a column direction;
    a plurality of initialization power lines which extend in the row direction, the plurality of initialization power lines including:
        a plurality of first power lines which are disposed in sub-pixel circuit areas of odd rows among the sub-pixel circuit areas and receive a first initialization voltage, wherein only one power line of the plurality of first power lines is disposed in each of the odd rows; and
        a plurality of second power lines which are disposed in sub-pixel circuit areas of even rows among the sub-pixel circuit areas and receive a second initialization voltage, wherein only one power line of the plurality of second power lines is disposed in each of the even rows, and
    a plurality of transmission lines which extend in the column direction, the plurality of transmission lines including:
        a plurality of first transmission lines which are disposed in sub-pixel circuit areas of only odd columns among the sub-pixel circuit areas and receive the first initialization voltage from the plurality of first power lines; and
        a plurality of second transmission lines which are disposed in sub-pixel circuit areas of only even columns among the sub-pixel circuit areas and receive the second initialization voltage from the second power lines.

2. The display device of claim 1, wherein the plurality of first power lines and the plurality of second power lines are alternately arranged with each other, and
the plurality of first transmission lines and the plurality of second transmission lines are alternately arranged with each other.

3. The display device of claim 1, wherein the plurality of first gate lines is disposed one by one in each of sub-pixel circuit areas of the plurality of sub-pixel circuit areas in the odd rows and sub-pixel circuit areas of the plurality of sub-pixel circuit areas in the even rows,
the plurality of data lines is disposed one by one in each of the odd columns and the even columns,
the plurality of first power lines is disposed in one side of first gate lines disposed in the sub-pixel circuit areas of the odd rows among the plurality of first gate lines,
the plurality of second power lines is disposed in one side of first gate lines disposed in the sub-pixel circuit areas of the even rows among the plurality of first gate lines,
the plurality of first transmission lines is disposed in one side of data lines disposed in the sub-pixel circuit areas of the odd columns among the plurality of data lines, and
the plurality of second transmission lines is disposed in one side of data lines disposed in the sub-pixel circuit areas of the even columns among the plurality of data lines.

4. The display device of claim 1, wherein a first transmission line of the plurality of first transmission lines is connected to a first power line of the plurality of first power lines through a first contact hole defined in a portion at which the first power line and the first transmission line cross each other, and
a second transmission line of the plurality of second transmission lines is connected to a second power line of the plurality of second power lines through a second contact hole defined in a portion at which the second power line and the second transmission line cross each other.

5. The display device of claim 4, wherein the plurality of first power lines and the plurality of second transmission lines do not contact each other, and
the plurality of second power lines and the plurality of first transmission lines do not contact each other.

6. The display device of claim 4, wherein the first contact hole is defined in a sub-pixel circuit area in which the odd row and the odd column cross among the sub-pixel circuit areas, and
the second contact hole is defined in a sub-pixel circuit area in which the odd row and the even column cross among the sub-pixel circuit areas.

7. The display device of claim 6, further comprising:
a sub-pixel circuit and a light emitting diode disposed in each of the sub-pixel circuit areas;
a first active pattern disposed in each of the sub-pixel circuit areas of the odd rows among the sub-pixel circuit areas; and
a second active pattern disposed in each of the sub-pixel circuit areas of the even rows among the sub-pixel circuit areas,
wherein the first active pattern is connected to the first transmission line through a third contact hole,
the first active pattern is connected to the second transmission line through a fourth contact hole,
the second active pattern is connected to the first transmission line through a fifth contact hole, and
the second active pattern is connected to the second transmission line through a sixth contact hole.

8. The display device of claim 7, further comprising:
a plurality of gate electrodes disposed on the first active pattern, and spaced apart from a first gate line of the plurality of first gate lines;
a second gate line spaced apart from the first gate line and the plurality of gate electrodes on the first active pattern; and
a third gate line spaced apart from the plurality of gate electrodes, the first gate line and the second gate line on the first active pattern,
wherein each of a plurality of portions in which the first active pattern and the plurality of gate electrodes overlap is defined as a first transistor.

9. The display device of claim 8, further comprising:
a first connection pattern spaced apart from a data line of the plurality of data lines,
wherein the first active pattern is connected to the first connection pattern through a seventh contact hole, and
the first connection pattern is disposed on the plurality of first power lines and is connected to the first transistor.

10. The display device of claim 9, wherein the first initialization voltage is provided from the first power line to the first transmission line through the first contact hole, is provided from the first transmission line to the first active pattern through the third contact hole, is provided from the first active pattern to the first connection pattern through the seventh contact hole, and is provided from the first connection pattern to the first transistor.

11. The display device of claim 8, further comprising:
a second connection pattern spaced apart from a data line of the plurality of data lines,
wherein the first active pattern is connected to the second connection pattern through a eighth contact hole, and
the second connection pattern is disposed on the plurality of second power lines and is connected to the light emitting diode.

12. The display device of claim 11, wherein the second initialization voltage is provided from the second power line to the second transmission line through the second contact hole, is provided from the second transmission line to the first active pattern through the fourth contact hole, is provided from the first active pattern to the second connection pattern through the eighth contact hole, and is provided from the second connection pattern to the light emitting diode.

13. The display device of claim 7, further comprising:
a plurality of gate electrodes disposed on the second active pattern, and spaced apart from a first gate line of the plurality of first gate line;
a second gate line spaced apart from the first gate line and the plurality of gate electrodes on the second active pattern; and
a third gate line spaced apart from the plurality of gate electrodes, the first gate line and the second gate line on the second active pattern,
wherein each of a plurality of portions in which the second active pattern and the plurality of gate electrodes overlap is defined as a first transistor.

14. The display device of claim 13, further comprising:
a third connection pattern spaced apart from the data line,
wherein the second active pattern is connected to the third connection pattern through a ninth contact hole, and
the third connection pattern is disposed on the first power line and is connected to the first transistor.

15. The display device of claim 14, wherein the first initialization voltage is provided from a first transmission line of the plurality of first transmission lines to the second active pattern through the fifth contact hole, is provided from the second active pattern to the third connection pattern through the ninth contact hole, and is provided from the third connection pattern to the first transistor.

16. The display device of claim 13, further comprising:

a fourth connection pattern spaced apart from the data line, wherein the second active pattern is connected to the fourth connection pattern through a tenth contact hole, and the fourth connection pattern is disposed on the plurality of second power lines and is connected to the light emitting diode.

17. The display device of claim 16, wherein the second initialization voltage is provided from the second transmission line to the second active pattern through the sixth contact hole, is provided from the second active pattern to the fourth connection pattern through the tenth contact hole, and is provided from the fourth connection pattern to the light emitting diode.

18. The display device of claim 1, further comprising:

a plurality of first initialization transmission lines which provide the first initialization voltage to the plurality of first power lines, and are connected to the plurality of first power lines, and a plurality of second initialization transmission lines which provide the second initialization voltage to the plurality of second power lines, and are connected to the plurality of second power lines.

19. The display device of claim 1, further comprising:

a plurality of power source voltage lines which extend in the column direction, and are spaced apart from a data line of the plurality of data lines.

20. The display device of claim 19, wherein the plurality of data lines and the plurality of power source voltage lines are disposed on the plurality of first power lines and the plurality of second power lines.

21. The display device of claim 1, wherein the plurality of first power lines and the plurality of second power lines are disposed in a same layer, the plurality of first transmission lines and the plurality of second transmission lines are disposed in a same layer, and the plurality of first transmission lines and the plurality of second transmission lines are disposed on the plurality of first power lines and the plurality of second power lines.

* * * * *